US012628521B2

(12) United States Patent　　　　(10) Patent No.: US 12,628,521 B2

Kim et al.　　　　　　　　　　　　(45) Date of Patent: May 12, 2026

(54) DISPLAY DEVICE

(71) Applicant: Samsung Display Co., LTD., Yongin-si (KR)

(72) Inventors: Jang Il Kim, Asan-si (KR); Kyoung Hae Min, Asan-si (KR); Jea Heon Ahn, Hwaseong-si (KR); Seong Yeon Lee, Asan-si (KR); Si Wan Jeon, Hwaseong-si (KR); Seok Joon Hong, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 357 days.

(21) Appl. No.: 18/257,292

(22) PCT Filed: Nov. 15, 2021

(86) PCT No.: PCT/KR2021/016642

§ 371 (c)(1),
(2) Date: Jun. 14, 2023

(87) PCT Pub. No.: WO2022/131568

PCT Pub. Date: Jun. 23, 2022

(65) Prior Publication Data

US 2024/0049552 A1　　Feb. 8, 2024

(30) Foreign Application Priority Data

Dec. 18, 2020　(KR) ........................ 10-2020-0178260

(51) Int. Cl.
H10K 59/38　　　(2023.01)
H10K 59/122　　(2023.01)
(Continued)

(52) U.S. Cl.
CPC ........... H10K 59/38 (2023.02); H10K 59/122 (2023.02); H10K 59/879 (2023.02);
(Continued)

(58) Field of Classification Search
CPC ............................ H10K 59/38; H10K 59/879
See application file for complete search history.

(56) References Cited

U.S. PATENT DOCUMENTS 9,698,204　B2　　7/2017　Kamura et al.
11,469,403　B2　10/2022　Joo et al.
(Continued)

FOREIGN PATENT DOCUMENTS

KR　　20180087502 A　　8/2018
KR　　20190047592 A　　5/2019
(Continued)

OTHER PUBLICATIONS

International Search Report dated Feb. 28, 2022, issued in corresponding International Patent Application No. PCT/KR2021/016642.

*Primary Examiner* — Mariceli Santiago
(74) *Attorney, Agent, or Firm* — CANTOR COLBURN LLP

(57)　　　　　　　ABSTRACT

A display device includes a display substrate and a color conversion substrate. The color conversion substrate includes: a second base substrate in which first to third light transmitting areas, and a light blocking area between adjacent light transmitting areas are defined, a first bank in the light blocking area, a first low refractive index layer between the second base substrate and the display substrate and covering the first bank. The color conversion substrate further includes a first wavelength conversion pattern in the first light transmitting area, a second wavelength conversion pattern in the second light transmitting area, and a light transmission pattern in the third light transmitting area, which are between the first low refractive index layer and the display substrate. The first low refractive index layer has a refractive index lower than at least one of the first wave- (Continued)

length conversion pattern or the second wavelength conversion pattern.

22 Claims, 30 Drawing Sheets

(51) Int. Cl.
  *H10K 59/80* (2023.01)
  *H10K 102/00* (2023.01)
(52) U.S. Cl.
  CPC ....... *H10K 59/8792* (2023.02); *H10K 59/873* (2023.02); *H10K 2102/351* (2023.02)

(56) References Cited

U.S. PATENT DOCUMENTS

| | | | |
|---|---|---|---|
| 11,569,306 B2* | 1/2023 | Lim ..................... | H10K 59/878 |
| 12,114,528 B2 | 10/2024 | Joo et al. | |
| 2020/0091464 A1* | 3/2020 | Park ..................... | H10K 50/13 |
| 2020/0292859 A1* | 9/2020 | Lee .................... | H10K 59/8792 |
| 2021/0005672 A1* | 1/2021 | Lee ........................ | G02B 5/201 |
| 2021/0273022 A1* | 9/2021 | Park ......................... | G02B 5/26 |
| 2024/0244934 A1* | 7/2024 | Park ..................... | H10K 59/35 |

FOREIGN PATENT DOCUMENTS

| | | |
|---|---|---|
| KR | 20190050886 A | 5/2019 |
| KR | 20190057190 A | 5/2019 |
| KR | 20200097380 A | 8/2020 |
| KR | 20200133086 A | 11/2020 |
| KR | 20210122406 A | 10/2021 |
| WO | 2019218342 A1 | 11/2019 |

* cited by examiner

DISPLAY DEVICE

TECHNICAL FIELD

The present disclosure relates to a display device.

BACKGROUND ART

The importance of display devices has steadily increased with the development of multimedia technology. Accordingly, various types of display devices such as a liquid crystal display ("LCD") device, an organic light emitting diode ("OLED") display device and the like have been developed.

Among the display devices, a self-light emitting display device includes a self-light emitting element such as an organic light emitting element. The self-light emitting element may include two opposite electrodes and a light emitting layer interposed therebetween. In the case of using the organic light emitting element as the self-light emitting element, the electrons and holes from the two electrodes are recombined in the light emitting layer to produce excitons, which transition from the excited state to the ground state, emitting light.

Such a self-light emitting display device is attracting attention as a next-generation display device because of being able to meet the high display quality demands such as wide viewing angle, high brightness and contrast, and quick response speed as well as being able to be made having a low power consumption, lightweight, and thin due to no necessity of a separate power source.

DISCLOSURE

Technical Problem

As one method for allowing each pixel of the display device to uniquely display one primary color, there is a method of arranging a color conversion pattern or a wavelength conversion pattern for each pixel on an optical path from a light source to a viewer.

Aspects of the present disclosure provide a display device having a reduced reflectance of external light in a light blocking area.

It should be noted that aspects of the present disclosure are not limited to the above-mentioned aspects, and other unmentioned aspects of the present disclosure will be clearly understood by those skilled in the art from the following descriptions.

Technical Solution

According to one embodiment of the present disclosure, there is provided a display device including a display substrate including: a light emitting element disposed on a first base substrate; and a color conversion substrate facing the display substrate, wherein the color conversion substrate includes a second base substrate in which a first light transmitting area, a second light transmitting area, a third light transmitting area, and a light blocking area disposed between adjacent light transmitting areas among the first to third light transmitting areas are defined; a first bank disposed in the light blocking area on the second base substrate; a first low refractive index layer disposed between the second base substrate and the display substrate and covering the first bank; a first wavelength conversion pattern disposed in the first light transmitting area and between the first low refractive index layer and the display substrate; a second wavelength conversion pattern disposed in the second light transmitting area and between the first low refractive index layer and the display substrate; and a light transmission pattern disposed in the third light transmitting area and between the first low refractive index layer and the display substrate, wherein the first low refractive index layer has a refractive index lower than a refractive index of at least one of the first wavelength conversion pattern or the second wavelength conversion pattern.

The first bank may include a bottom surface facing the display substrate and a side surface facing one of the adjacent light transmitting areas, and the first low refractive index layer may cover the bottom surface and the side surface of the first bank.

The first low refractive index layer may be in contact with each of the bottom surface and the side surface of the first bank.

The refractive index of the first low refractive index layer may be about 1.3 to about 1.4, and the refractive index of the at least one of the first wavelength conversion pattern or the second wavelength conversion pattern may be about 1.6 or more.

The first low refractive index layer may include an organic material and inorganic particles, and the inorganic particles may be dispersed in the organic material and have hollow particles.

In the first to third light transmitting areas, the first low refractive index layer may have a first thickness, and in the light blocking area, the first low refractive index layer may have a second thickness. The first thickness may be greater than the second thickness.

The first thickness may be at least five times greater than the second thickness.

The display device may further include a second low refractive index layer disposed between the first low refractive index layer and the first to second wavelength conversion patterns, and between the first low refractive index layer and the light transmission pattern. The second low refractive index layer may cover the bottom surface and the side surface of the first bank.

A refractive index of the second low refractive index layer may be about 1.2 to about 1.3.

The second low refractive index layer may include an inorganic material.

The display device may further include a second bank disposed between the display substrate and the second low refractive index layer on the light blocking area, and the second bank may be in direct contact with the second low refractive index layer.

The second bank may include a liquid repellent material, and the first to second wavelength conversion patterns and the light transmission pattern may each be in direct contact with the second low refractive index layer and the second bank.

The light emitting element may emit light of a first color, the first wavelength conversion pattern may be configured to convert the light of the first color into light of a second color, the second wavelength conversion pattern may be configured to convert the light of the first color into light of a third color, and the light transmission pattern may be configured to transmit the light of the first color as it is without wavelength change.

The display device may further include a first color filter disposed in the first light transmitting area and between the second base substrate and the first low refractive index layer, a second color filter disposed in the second light transmitting area and between the second base substrate and the first low refractive index layer, and a third color filter disposed in the third light transmitting area and the light blocking area and between the second base substrate and the first low refractive index layer. The first color filter may be configured to block the light of the first color and the light of the third color, the second color filter may be configured to block the light of the first color and the light of the second color, and the third color filter may be configured to block the light of the second color and the light of the third color.

The first color filter may be further disposed in the adjacent light blocking area, and the second color filter may be further disposed in the adjacent light blocking area.

The display device may further include a black matrix disposed between the third color filter disposed in the light blocking area and the first bank.

The display device may further include a second bank disposed between the display substrate and the first low refractive index layer on the light blocking area, and the second bank may be in direct contact with the first low refractive index layer.

According to another embodiment of the present disclosure, there is provided a display device including: a base substrate in which a first emission area, a second emission area, a third emission area, and a non-emission area disposed between adjacent emission areas are defined; light emitting elements disposed in each of the emission areas on the base substrate; a thin film encapsulation layer disposed on the light emitting elements; first banks disposed on the thin film encapsulation layer and disposed in the non-emission area; a first wavelength conversion pattern disposed between adjacent first banks among the first banks on the thin film encapsulation layer and disposed in the first emission area; a second wavelength conversion pattern disposed between adjacent first banks among the first banks on the thin film encapsulation layer and disposed in the second emission area; a light transmission pattern disposed between adjacent first banks among the first banks on the thin film encapsulation layer and disposed in the third emission area; and a low refractive index layer covering the first and second wavelength conversion patterns, the light transmission pattern, and the first bank, where the low refractive index layer has a refractive index lower than a refractive index of at least one of the first wavelength conversion pattern or the second wavelength conversion pattern.

The low refractive index layer may be in direct contact with a top surface and a side surface of the first banks.

The display device may further include a second bank disposed on the non-emission area on the low refractive index layer.

The display device may further include a first color filter disposed in the first emission area, a second color filter disposed in the second emission area, and a third color filter disposed in the third emission area, the first to third color filters being disposed on the low refractive index layer and the second bank.

The refractive index of the low refractive index layer may be about 1.3 to about 1.4, and the refractive index of the at least one of the first wavelength conversion pattern or the second wavelength conversion pattern may be about 1.6 or more.

The details of other embodiments are included in the following description and the accompanying drawings.

Advantageous Effects

According to the display device according to the embodiment of the present disclosure, the reflectance of external light may be reduced in the light blocking area.

In addition, wavelength conversion efficiency may be increased in each of the wavelength conversion patterns.

Advantageous effects according to the present disclosure are not limited to those mentioned above, and various other advantageous effects are included herein.

DESCRIPTION OF DRAWINGS

FIG. 29 is a cross-sectional view of a display device according to still another embodiment.

FIG. 30 is a cross-sectional view of a display device according to still another embodiment.

MODES OF THE INVENTION

Figure 1:
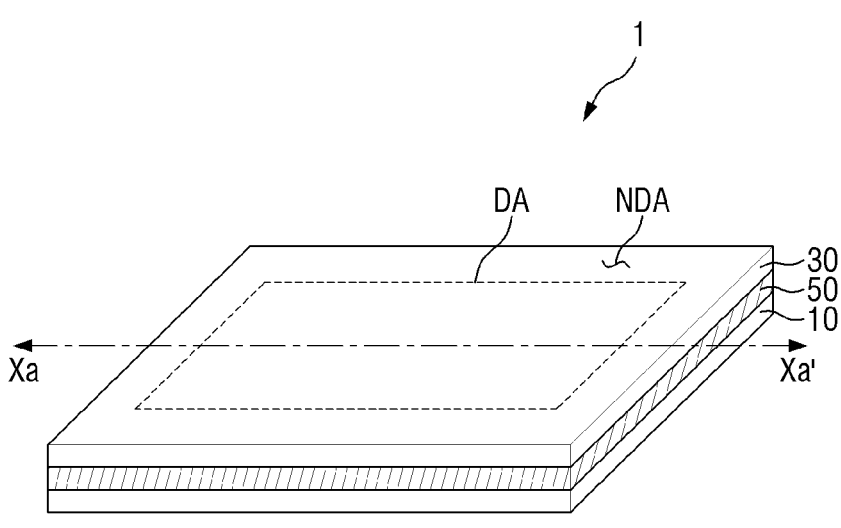
FIG. 1 is a perspective view of a display device according to one embodiment.
Figure 1:
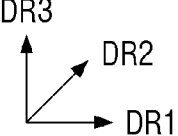

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the invention to those skilled in the art, and the present disclosure will only be defined by the appended claims.

When an element or layer is referred to as being "on" another element or layer, it may be directly on the other element or layer or intervening elements or layers may be present. In contrast, when an element is referred to as being "directly on" another element, there are no intervening elements present. The same reference numbers indicate the same components throughout the specification.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use in addition to the orientation depicted in the figures. For example, if the device in the figures is turned over, elements described as "below" or "beneath" other elements or features would then be oriented "above" the other elements or features. Thus, the term "below" can encompass both an orientation of above and below.

Although the terms "first", "second", "third", "fourth", etc. may be used herein to describe various components, these components should not be limited by these terms. These terms are used to distinguish one component from another component. Thus, a first component discussed below could be termed any one of a second component, a third component, and a fourth component without departing from the teachings of the present disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Hereinafter, embodiments of the present disclosure will be described with reference to the accompanying drawings. **

Figure 2:
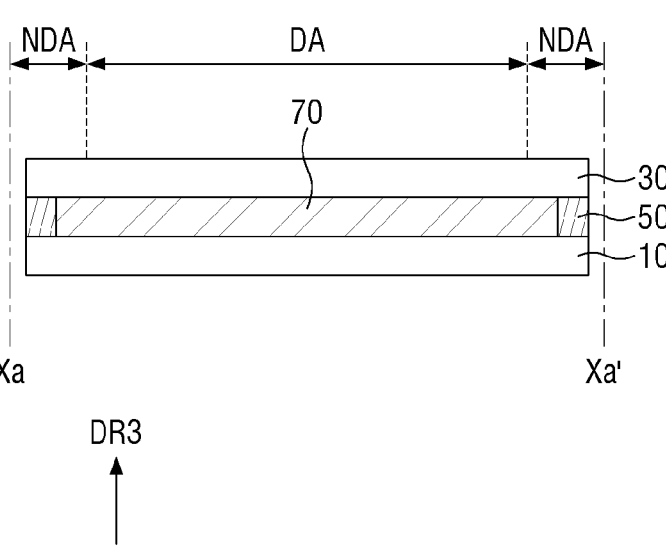
FIG. 2 is a schematic cross-sectional view of a display device according to one embodiment taken along line Xa-Xa' of FIG. 1.
Figure 3:
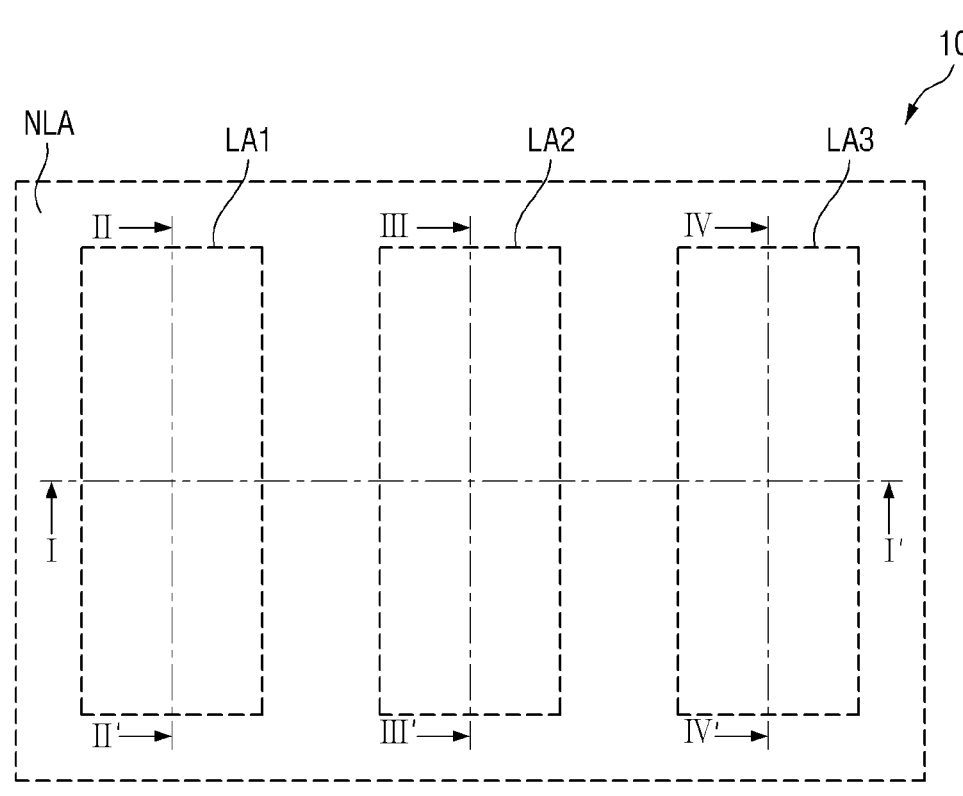
FIG. 3 is a schematic plan view of the display substrate in the display area of the display device shown in FIGS. 1 and 2.
Figure 3:
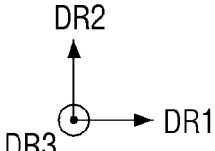

FIG. 1 is a schematic perspective view of a display device according to one embodiment. FIG. 2 is a schematic cross-sectional view of a display device according to one embodiment taken along line Xa-Xa' of FIG. 1. FIG. 3 is a schematic plan view of a display substrate shown in FIGS. 1 and 2, and more specifically, a schematic plan view of a display substrate in a display area. As used herein, the "plan view" is a view in a thickness direction (i.e., third direction DR3) of the display device 1.

Referring to FIGS. 1 to 3, a display device 1 may be applied to a variety of electronic apparatuses, i.e., medium- or small-sized electronic devices such as a tablet PC, a smartphone, a car navigation unit, a camera, a center information display ("CID") provided in a vehicle, a wristwatch-type electronic device, a personal digital assistant ("PDA"), a portable multimedia player ("PMP") and a game console, and medium and large electronic devices such as a television, an external billboard, a monitor, a personal computer and a laptop computer. These are merely suggested as examples, but the display device 1 may also be applied to other electronic devices without departing from the present disclosure.

In some embodiments, the display device 1 may have a rectangular shape in plan view. The display device 1 may include two first sides extending in a first direction DR1 and two second sides extending in a second direction DR2 intersecting the first direction DR1. A corner where the first side and the second side of the display device 1 meet may have a right angle. However, the present disclosure is not limited thereto, and the corner may have a curved surface. In some embodiments, the first side may be longer than the second side, but is not limited thereto. The planar shape of the display device 1 is not limited to the exemplified one, but may have a circular shape or other shapes.

The display device 1 may include a display area DA displaying an image and a non-display area NDA not displaying an image. In some embodiments, the non-display area NDA may be located around the display area DA and may surround the display area DA.

Unless otherwise defined, the terms "above," "upper side," "upper portion," "top," and "top surface," as used herein, refer to a direction indicated by an arrow in a third direction DR3 intersecting the first and second directions DR1 and DR2 based on the drawings, and the terms "below," "lower side," "lower portion," "bottom," and "bottom surface," as used herein, refer to a direction opposite to the direction indicated by the arrow in the third direction DR3 based on the drawing.

In some embodiments, the display device 1 may include, as a schematic stacked structure, a display substrate 10 and a color conversion substrate 30 facing the display substrate 10, and may further include a sealing portion 50 for coupling the display substrate 10 and the color conversion substrate 30, and a filling layer 70 filled between the display substrate 10 and the color conversion substrate 30.

The display substrate 10 may include elements and circuits for displaying an image, for example, a pixel circuit such as a switching element, a pixel defining layer and a self-light emitting element that define an emission area and a non-emission area, which will be described later, in the display area DA. In an embodiment, the self-light emitting element may include at least one of an organic light emitting diode, a quantum dot light emitting diode, an inorganic micro light emitting diode (e.g., micro LED), or an inorganic nano light emitting diode (e.g., nano LED). Hereinafter, for simplicity of description, a case where the self-light emitting element is an organic light emitting element will be described as an example.

The color conversion substrate 30 may be located above the display substrate to face the display substrate 10. In some embodiments, the color conversion substrate 30 may include a color conversion pattern for converting the color of incident light. In some embodiments, the color conversion pattern may include at least one of a color filter and a wavelength conversion pattern.

The sealing portion 50 may be positioned between the display substrate 10 and the color conversion substrate 30 in the non-display area NDA. The sealing portion may be disposed along edges of the display substrate 10 and the color conversion substrate 30 in the non-display area NDA to surround the display area DA in plan view. The display substrate 10 and the color conversion substrate 30 may be bonded to each other through the sealing portion 50.

In some embodiments, the sealing portion 50 may be made of an organic material. For example, the sealing portion 50 may be made of an epoxy-based resin, but is not limited thereto.

The filling layer 70 may be positioned in a space surrounded by the sealing portion 50 between the display substrate 10 and the color conversion substrate 30. The filling layer 70 may fill the space between the display substrate 10 and the color conversion substrate 30.

In some embodiments, the filling layer 70 may be made of a material capable of transmitting light. In some embodiments, the filling layer 70 may be made of an organic material. For example, the filling layer 70 may be formed of a Si-based organic material, an epoxy-based organic material, or the like, but is not limited thereto. In another embodiment, the filling layer 70 may be omitted.

Figure 4:
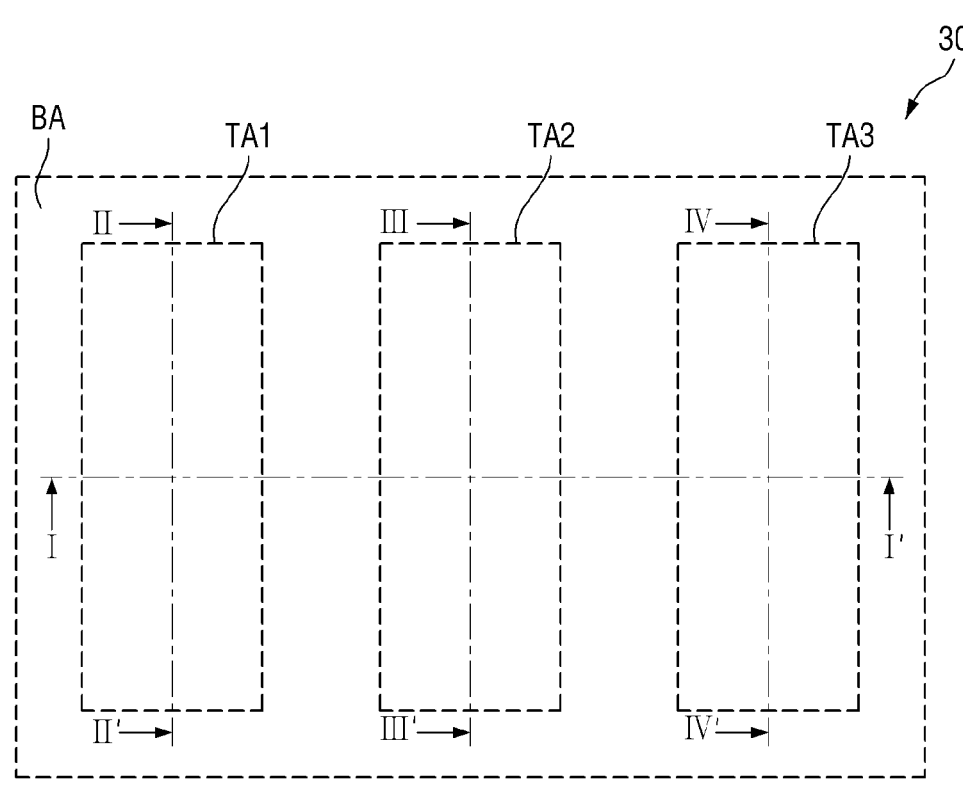
FIG. 4 is a schematic plan view of a color conversion substrate in the display area of the display device shown in FIGS. 1 and 2.
Figure 4:
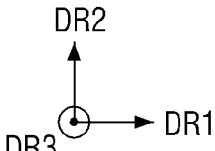

FIG. 3 is a schematic plan view of the display substrate in the display area of the display device shown in FIGS. 1 and 2. FIG. 4 is a schematic plan view of a color conversion substrate in the display area of the display device shown in FIGS. 1 and 2.

Referring further to FIGS. 3 and 4 in addition to FIGS. 1 and 2, a plurality of emission areas LA1, LA2, and LA3 and a non-emission area NLA may be defined on the display substrate 10 in the display area DA. The emission areas LA1, LA2, and LA3 may be regions where light generated by the light emitting element of the display substrate 10 is emitted to the outside of the display substrate 10, and the non-emission area NLA may be a region where light is not emitted to the outside of the display substrate 10.

In some embodiments, light emitted from each of the emission areas LA1, LA2, and LA3 to the outside of the display substrate 10 may be light of a first color. In some embodiments, the light of the first color may be blue light and may have a peak wavelength in a range of about 440 nanometers (nm) to about 480 nm.

In some embodiments, a first emission area LA1, a second emission area LA2, and a third emission area LA3 may be sequentially and repeatedly disposed in the display area DA along the first direction DR1.

Each of the emission areas LA1, LA2, and LA2 may have a rectangular shape in plan view. The emission areas LA1, LA2, and LA3 may include short sides extending along the first direction DR1 and long sides extending along the second direction DR2.

In some embodiments, the width of the third emission area LA3 measured along the first direction DR1 may be smaller than each of the width of the first emission area LA1 and the width of the second emission area LA2 measured along the first direction DR1. In some embodiments, the width of the first emission area LA1 and the width of the second emission area LA2 may be different from each other. For example, the width of the second emission area LA2 may be greater than the width of the first emission area LA1. However, the present disclosure is not limited to the above-described example. In another embodiment, the width of the first emission area LA1 measured along the first direction DR1, the second width of the second emission area LA2 measured along the first direction DR1, and the width of the third emission area LA3 may be substantially the same. In another embodiment, the area of the first emission area LA1, the area of the second emission area LA2, and the area of the third emission area LA3 may be substantially the same.

The non-emission area NLA may be positioned in the periphery of each of the emission areas LA1, LA2, and LA3. The non-emission area NLA may be positioned between adjacent emission areas LA1, LA2, and LA3, and may surround both the short sides (upper and lower short sides in the second direction DR2) and the long sides (right and left long sides in the first direction DR1) of each of the emission areas LA1, LA2, and LA3.

In FIG. 3, only the first row formed by each of the emission areas LA1, LA2, and LA3 sequentially disposed along the first direction DR1 is illustrated, but each of the emission areas LA1, LA2, and LA3, which are sequentially disposed along the first direction DR1, may form another row adjacent to the first row along the second direction DR2. The number of other rows may be plural.

In the display area DA, a plurality of light transmitting areas TA1, TA2, and TA3 and a light blocking area BA may be defined in the color conversion substrate 30. The light transmitting areas TA1, TA2, and TA3 may be regions where light emitted from the display substrate 10 passes through the color conversion substrate 30 and is provided to the outside of the display device 1. The light blocking area BA may be a region where light emitted from the display substrate 10 does not transmit.

In some embodiments, a first light transmitting area TA1, a second light transmitting area TA2, and a third light transmitting area TA3 may be sequentially and repeatedly disposed along the first direction DR1 on the color conversion substrate 30 in the display area DA. The first light transmitting area TA1 may correspond to or overlap the first emission area LA1. Similarly, the second light transmitting area TA2 may correspond to or overlap the second emission area LA2, and the third light transmitting area TA3 may correspond to or overlap the third emission area LA3.

In some embodiments, the light of the first color provided from the display substrate 10 may pass through the first light transmitting area TA1, the second light transmitting area TA2, and the third light transmitting area TA3 and be provided to the outside of the display device 1. When the light emitted from the first light transmitting area TA1 to the outside of the display device 1 is referred to as first emission light, the light emitted from the second light transmitting area TA2 to the outside of the display device 1 is referred to as second emission light and the light emitted from the third light transmitting area TA3 to the outside of the display device 1 is referred to as third emission light, the first emission light may be light of a second color different from the first color, the second emission light may be light of a third color different from the first color and the second color, and the third emission light may be light of the first color.

In some embodiments, the light of the first color may be blue light having a peak wavelength in a range of about 440 nm to about 480 nm as described above, and the light of the second color may be red light having a peak wavelength in a range of about 610 nm to about 650 nm. In addition, light of the third color may be green light having a peak wavelength in a range of about 510 nm to about 550 nm.

Each of the light transmitting areas TA1, TA2, and TATA2 may have a rectangular shape in plan view. The light transmitting areas TA1, TA2, and TA3 may include short sides extending along the first direction DR1 and long sides extending along the second direction DR2.

Similarly to the first emission area LA1, the second emission area LA2, and the third emission area LA3, in some embodiments, the width of the third light transmitting area TA3 measured along the first direction DR1 may be smaller each of than the width of the first light transmitting area TA1 and the width of the second light transmitting area TA2 measured along the first direction DR1. In some embodiments, the width of the first light transmitting area LA1 and the width of the second light transmitting area LA2 may be different from each other. For example, the width of the second light transmitting area TA2 may be greater than the width of the first light transmitting area TA1. However, the present disclosure is not limited to the above-described example. In another embodiment, the width of the first light transmitting area TA1 measured along the first direction DR1, the second width of the second light transmitting area TA2 measured along the first direction DR1, and the width of the third light transmitting area TA3 may be substantially the same. In another embodiment, the area of the first light transmitting area TA1, the area of the second light transmitting area TA2, and the area of the third light transmitting area TA3 may be substantially the same.

A light non-transmitting area NTA may be positioned in the peripheral of each of the light transmitting areas TA1, TA2, and TA3. The light non-transmitting area NTA may be positioned between the adjacent light transmitting areas TA1, TA2, and TA3, and may surround both the short sides (upper and lower short sides in the second direction DR2) and the long sides (right and left long sides in the first direction DR1) of each of the light transmitting areas TA1, TA2, and TA3.

In FIG. 4, only the first row formed by each of the light transmitting areas TA1, TA2, and TA3 sequentially disposed along the first direction DR1 is illustrated, but each of the light transmitting areas TA1, TA2, and TA3, which are sequentially disposed along the first direction DR1, may form another row adjacent to the first row along the second direction DR2. The number of other rows may be plural.

Hereinafter, the structure of the display device 1 will be described in more detail. **

Figure 5:
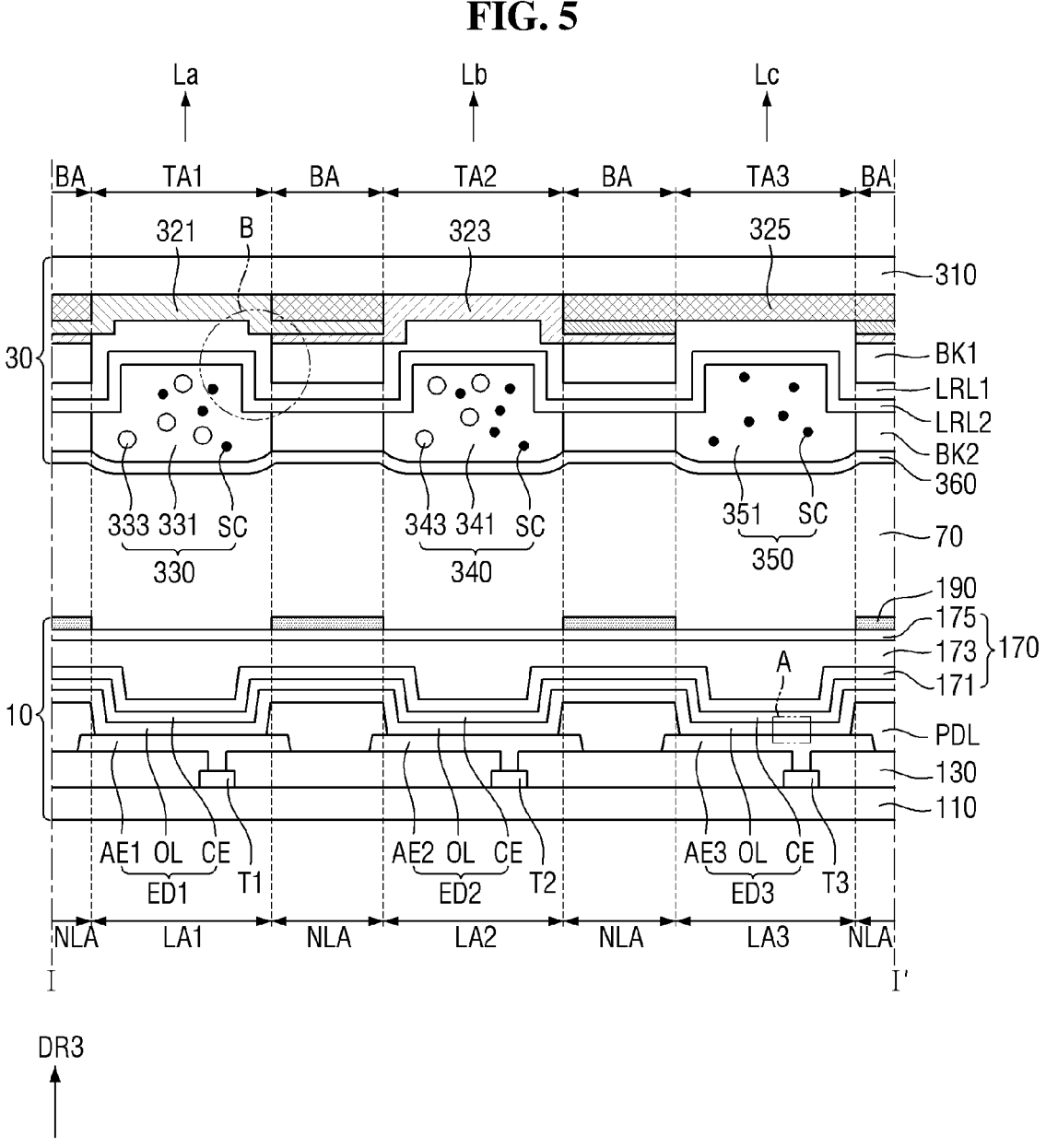
FIG. 5 is a cross-sectional view of a display device according to one embodiment taken along line I-I' of FIGS. 3 and 4.
Figure 6:
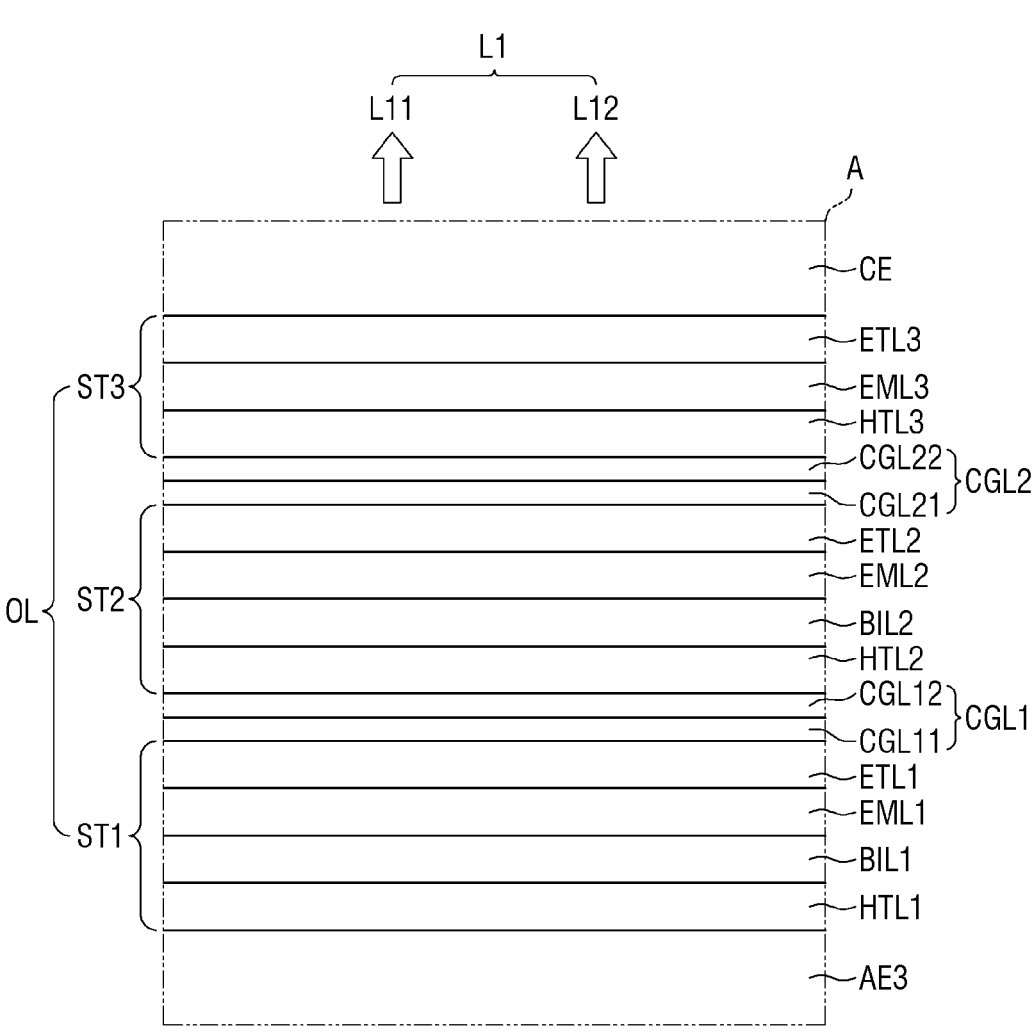
FIG. 6 is an enlarged cross-sectional view of area A of FIG. 5.
Figure 7:
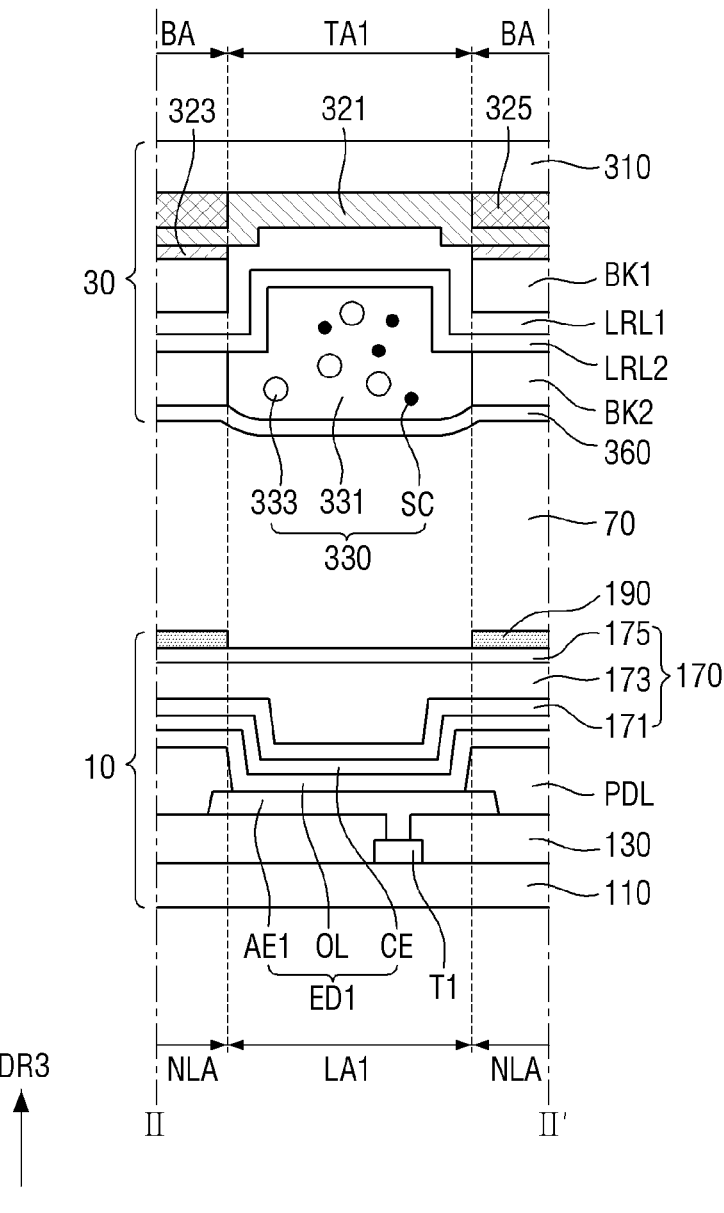
FIG. 7 is a cross-sectional view of a display device according to one embodiment taken along line II-II' of FIGS. 3 and 4.
Figure 8:
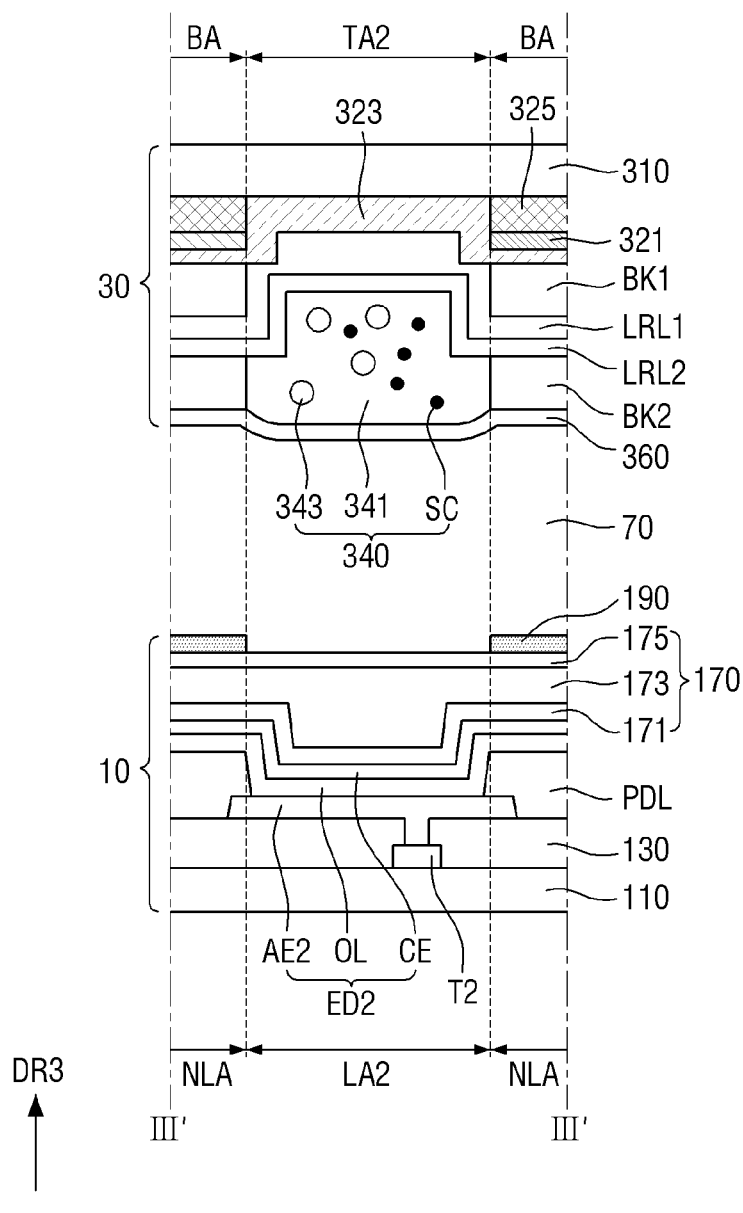
FIG. 8 is a cross-sectional view of a display device according to one embodiment taken along line III-III' of FIGS. 3 and 4.
Figure 9:
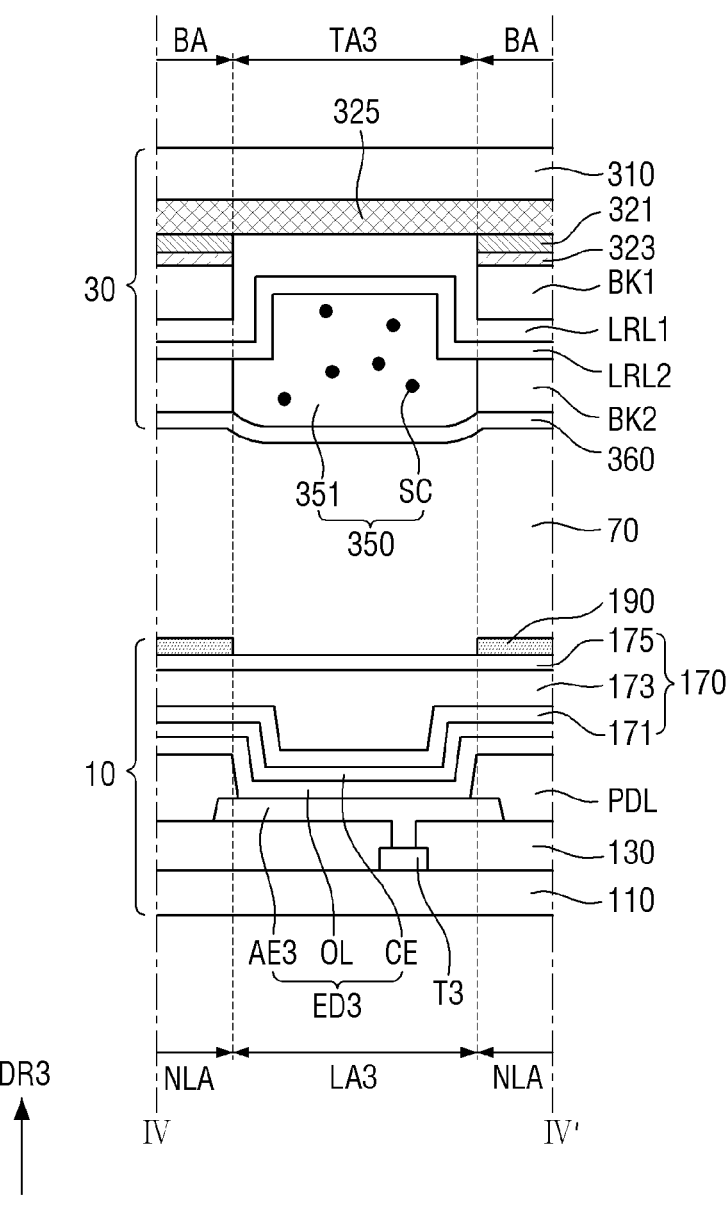
FIG. 9 is a cross-sectional view of a display device according to one embodiment taken along line IV-IV' of FIGS. 3 and 4.

FIG. 5 is a cross-sectional view of a display device according to one embodiment taken along line I-I' of FIGS. 3 and 4. FIG. 6 is an enlarged cross-sectional view of area A of FIG. 5. FIG. 7 is a cross-sectional view of a display device according to one embodiment taken along line II-If of FIGS. 3 and 4. FIG. 8 is a cross-sectional view of a display device according to one embodiment taken along line of FIGS. 3 and 4. FIG. 9 is a cross-sectional view of a display device according to one embodiment taken along line IV-IV' of FIGS. 3 and 4.

Referring further to FIGS. 5 to 9 in addition to FIGS. 3 and 4, the display device 1 may include the display substrate 10 and the color conversion substrate 30 as described above, and may further include the filling layer 70 positioned between the display substrate 10 and the color conversion substrates 30.

Hereinafter, the display substrate 10 will be described in more detail.

A first base substrate 110 may be made of a light transmitting material. In some embodiments, the first base substrate 110 may be a glass substrate or a plastic substrate. When the first base substrate 110 is a plastic substrate, the first base substrate 110 may have flexibility. In some embodiments, the first base substrate 110 may further include a separate layer, e.g., a buffer layer or an insulating layer, disposed on the glass substrate or the plastic substrate.

In some embodiments, as described above, the plurality of emission areas LA1, LA2, and LA3 and the non-emission area NLA may be defined in the first base substrate 110.

Switching elements T1, T2 and T3 may be located on the first base substrate 110. In some embodiments, a first switching element T1 may be located in the first emission area LA1, a second switching element T2 may be located in the second emission area LA2, and a third switching element T3 may be located in the third emission area LA3. However, the present disclosure is not limited thereto, and in another embodiment, at least one of the first switching element T1, the second switching element T2 and the third switching element T3 may be located in the non-emission area NLA.

In some embodiments, each of the first switching element T1, the second switching element T2 and the third switching element T3 may be a thin film transistor including polysilicon or a thin film transistor including an oxide semiconductor.

Although not shown in the drawings, a plurality of signal lines (e.g., gate line, data line, power line, and the like) that transmit signals to the switching elements may be further positioned on the first base substrate 110.

An insulating layer 130 may be located on the first switching element T1, the second switching element T2 and the third switching element T3. In some embodiments, the insulating layer 130 may be a planarization layer. In some embodiments, the insulating layer 130 may be formed of an organic layer. For example, the insulating layer 130 may include acrylic resin, epoxy resin, imide resin, ester resin, or the like. In some embodiments, the insulating layer 130 may include a positive photosensitive material or a negative photosensitive material.

A first anode electrode AE1, a second anode electrode AE2, and a third anode electrode AE3 may be positioned on the insulating layer 130. The first anode electrode AE1 may be located in the first emission area LA1, but at least a part thereof may extend to the non-emission area NLA. The second anode electrode AE2 may be located in the second emission area LA2, and at least a part thereof may extend to the non-emission area NLA. The third anode electrode AE3 may be located in the third emission area LA3, and at least a part thereof may extend to the non-emission area NLA. The first anode electrode AE1 may be connected to the first switching element T1 through the insulating layer 130, and the second anode electrode AE2 may be connected to the second switching element T2 through the insulating layer 130. The third anode electrode AE3 may be connected to the third switching element T3 through the insulating layer 130.

In some embodiments, the widths or areas of the first anode electrode AE1, the second anode electrode AE2 and the third anode electrode AE3 may be different from each other. The width and area size relationship of each of the anode electrodes AE1, AE2, and AE3 may be the same as the width and area size relationship of each of the emission areas LA1, LA2, and LA3 described above in FIG. 3, but is not limited thereto.

The first anode electrode AE1, the second anode electrode AE2, and the third anode electrode AE3 may be reflective electrodes. In this case, the first anode electrode AE1, the second anode electrode AE2 and the third anode electrode AE3 may be a metal layer including metal such as Ag, Mg, Al, Pt, Pd, Au, Ni, Nd, Ir, or Cr. In another embodiment, the first anode electrode AE1, the second anode electrode AE2 and the third anode electrode AE3 may further include a metal oxide layer stacked on the metal layer. In an embodiment, the first anode electrode AE1, the second anode electrode AE2 and the third anode electrode AE3 may have a double-layer structure of ITO/Ag, Ag/ITO, ITO/Mg or ITO/MgF, or may have a multilayer structure of, e.g., ITO/Ag/ITO.

A pixel defining layer PDL may be positioned on the first anode electrode AE1, the second anode electrode AE2 and the third anode electrode AE3. The pixel defining layer PDL may include an opening exposing the first anode electrode AE1, an opening exposing the second anode electrode AE2 and an opening exposing the third anode electrode AE3, and may define the first emission area LA1, the second emission area LA2, the third emission area LA3 and the non-emission area NLA. That is, a region of the first anode electrode AE1 which is exposed without being covered by the pixel defining layer PDL may be the first emission area LA1. Similarly, a region of the second anode electrode AE2 which is exposed without being covered by the pixel defining layer PDL may be the second emission area LA2, and a region of the third anode electrode AE3 which is exposed without being covered by the pixel defining layer PDL may be the third emission area LA3. Further, a region where the pixel defining layer PDL is located may be the non-emission area NLA.

In some embodiments, the pixel defining layer PDL may include an organic insulating material selected from the group consisting of acrylic resin, epoxy resin, phenolic resin, polyamide resin, polyimide resin, unsaturated polyester resin, polyphenylene ether resin, polyphenylenesulfide resin and benzocyclobutene ("BCB").

In some embodiments, the pixel defining layer PDL may be disposed to overlap a bank of the color conversion substrate 30 in a plan view to be described later.

A light emitting layer OL may be located on the first anode electrode AE1, the second anode electrode AE2 and the third anode electrode AE3.

In some embodiments, the light emitting layer OL may have a shape of a continuous film formed over the plurality of emission areas LA1, LA2, and LA3 and the non-emission area NLA. A more detailed description of the light emitting layer OL will be given later.

A cathode electrode CE may be located on the light emitting layer OL. In some embodiments, the cathode electrode CE may have a semi-transmissive or transmissive property. When the cathode electrode CE has a semi-transmissive property, the cathode electrode CE may include Ag, Mg, Cu, Al, Pt, Pd, Au, Ni, Nd, Ir, Cr, Li, Ca, LiF/Ca, LiF/Al, Mo, Ti or a compound or mixture thereof, such as a mixture of Ag and Mg. In addition, when the cathode electrode CE has a thickness of tens to hundreds of angstroms, the cathode electrode CE may have a semi-transmissive property.

When the cathode electrode CE has a transmissive property, the cathode electrode CE may include a transparent conductive oxide ("TCO"). For example, the cathode electrode CE may include tungsten oxide (WxOy), titanium oxide (TiO$_2$), indium tin oxide ("ITO"), indium zinc oxide ("IZO"), zinc oxide (ZnO), indium tin zinc oxide ("ITZO"), magnesium oxide (MgO) or the like.

The first anode electrode AE1, the light emitting layer OL and the cathode electrode CE may constitute a first emitting element EDE The second anode electrode AE2, the light emitting layer OL and the cathode electrode CE may constitute a second light emitting element ED2. The third anode electrode AE3, the light emitting layer OL and the cathode electrode CE may constitute a third light emitting element ED3. Each of the first light emitting element ED1, the second light emitting element ED2 and the third light emitting element ED3 may emit emission light L1, and the emission light L1 may be provided to the color conversion substrate 30.

As shown in FIG. 6, the emission light L1 finally emitted from the light emitting layer OL may be mixed light in which a first component L11 and a second component L12 are mixed. Each of the first component L11 and the second component L12 in the emission light L1 may have a peak wavelength within a range of about 440 nm or more and less than about 480 nm. That is, the emission light L1 may be blue light.

In some embodiments, the light emitting layer OL may have a structure, e.g., a tandem structure, in which a plurality of light emitting layers are disposed to overlap each other. For example, the light emitting layer OL may include a first stack ST1 including a first light emitting layer EML1, a second stack ST2 positioned on the first stack ST1 and including a second light emitting layer EML2, a third stack ST3 positioned on the second stack ST2 and including a third light emitting layer EML3, a first charge generation layer CGL1 positioned between the first stack ST1 and the second stack ST2, and a second charge generation layer CGL2 positioned between the second stack ST2 and the third stack ST3. The first stack ST1, the second stack ST2, and the third stack ST3 may be disposed to overlap each other in a plan view.

The first light emitting layer EML1, the second light emitting layer EML2, and the third light emitting layer EML3 may be disposed to overlap each other in a plan view.

In some embodiments, all the first light emitting layer EML1, the second light emitting layer EML2, and the third light emitting layer EML3 may emit light of the first color, e.g., blue light. For example, each of the first light emitting layer EML1, the second light emitting layer EML2, and the third light emitting layer EML3 may be a blue light emitting layer, and may include an organic material.

In some embodiments, at least one of the first light emitting layer EML1, the second light emitting layer EML2, or the third light emitting layer EML3 may emit first blue light having a first peak wavelength, and at least another one thereof may emit second blue light having a second peak wavelength different from the first peak wavelength. For example, any one of the first light emitting layer EML1, the second light emitting layer EML2, and the third light emitting layer EML3 may emit the first blue light having the first peak wavelength, and the other two thereof may emit the second blue light having the second peak wavelength. That is, the emission light L1 finally emitted from the light emitting layer OL may be mixed light in which the first component L11 and the second component L12 are mixed, the first component L11 may be the first blue light having the first peak wavelength, and the second component L12 may be the second blue light having the second peak wavelength.

In some embodiments, one of the first peak wavelength and the second peak wavelength may be in a range of about 440 nm or more and less than about 460 nm, and the other one thereof may be in a range of about 460 nm or more and about 480 nm or less. However, the range of the first peak wavelength and the range of the second peak wavelength are not limited thereto. For example, the range of the first peak wavelength and the range of the second peak wavelength may both include about 460 nm. In some embodiments, one of the first blue light and the second blue light may be deep blue color, and the other one thereof may be sky blue color.

In accordance with some embodiments, the emission light L1 emitted from the light emitting layer OL may be blue light, and may include a long wavelength component and a short wavelength component. Therefore, ultimately, the light emitting layer OL may emit blue light having an emission peak in a broader wavelength range as the emission light L1. Accordingly, there is an advantage in that color visibility may be improved at a side viewing angle compared to a conventional light emitting element emitting blue light having a sharp emission peak.

In some embodiments, each of the first light emitting layer EML1, the second light emitting layer EML2, and the third light emitting layer EML3 may include a host and a dopant. A material of the host is not particularly limited as long as it is generally used. For example, tris(8-hydroxyquinolinato) aluminium (Alq3), 4,4'-bis(N-carbazolyl)-1,1'-biphenyl ("CBP"), poly(n-vinylcabazole) ("PVK"), 9,10-di(naphtha-lene-2-yl)anthracene ("ADN"), 4,4',4"-Tris(carbazol-9-yl)-triphenylamine ("TCTA"), 1,3,5-tris(N-phenylbenzimida-zole-2-yl)benzene (TPBi), 3-tert-butyl-9,10-di(naphth-2-yl) anthracene ("TBADN"), distyrylarylene ("DSA"), 4,4'-bis (9-carbazolyl)-2,2'-dimethyl-biphenyl ("CDBP"), or 2-methyl-9,10-bis(naphthalen-2-yl)anthracene ("MADN"), or the like may be used as the material of the host.

Each of the first light emitting layer EML1, the second light emitting layer EML2, and the third light emitting layer EML3 emitting blue light may include, e.g., a fluorescent material including any one selected from the group consist-ing of spiro-DPVBi, spiro-6P, distyryl-benzene ("DSB"), distyryl-arylene ("DSA"), polyfluorene ("PFO")-based polymer, and poly(p-phenylene vinylene) ("PPV")-based polymer. As another example, a phosphorescent material including an organometallic complex such as (4,6-F2ppy) 2Irpic may be included.

As described above, at least one of the first light emitting layer EML1, the second light emitting layer EML2, or the third light emitting layer EML3 emits blue light of a wavelength range different from a light of at least another one of the first light emitting layer EML1, the second light emitting layer EML2, or the third light emitting layer EML3. In order to emit blue light in different wavelength ranges, the first light emitting layer EML1, the second light emitting layer EML2, and the third light emitting layer EML3 may include the same material, and a resonance distance may be adjusted. Alternatively, in order to emit blue light in different wavelength ranges, at least one of the first light emitting layer EML1, the second light emitting layer EML2, and the third light emitting layer EML3, and at least another one of the first light emitting layer EML1, the second light emitting layer EML2, and the third light emitting layer EML3 may include different materials from each other.

However, the present disclosure is not limited thereto. All of the first light emitting layer EML1, the second light emitting layer EML2, and the third light emitting layer EML3 may emit blue light having a peak wavelength of about 440 nm to about 480 nm, and may be made of the same material.

Alternatively, in still another embodiment, at least one of the first light emitting layer EML1, the second light emitting layer EML2, or the third light emitting layer EML3 may emit first blue light having a first peak wavelength, another one thereof may emit second blue light having a second peak wavelength different from the first peak wavelength, and the remaining one thereof may emit third blue light having a third peak wavelength different from the first peak wave-length and the second peak wavelength. In some other embodiments, any one of the first peak wavelength, the second peak wavelength, and the third peak wavelength may be in a range of about 440 nm or more and less than about 460 nm. Another one of the first peak wavelength, the second peak wavelength, and the third peak wavelength may be in a range of about 460 nm or more and less than about 470 nm, and the remaining one thereof may be in a range of about 470 nm or more and about 480 nm or less.

According to still some other embodiments, the emission light L1 emitted from the light emitting layer OL is blue light and includes a long wavelength component, an intermediate wavelength component, and a short wavelength component. Therefore, ultimately, the light emitting layer OL may emit blue light having an emission peak in a broader wavelength range as the emission light L1, thereby improving the color visibility at a side viewing angle.

In accordance with the above-described embodiments, compared to the conventional light emitting element that does not adopt a tandem structure, i.e., a structure in which a plurality of light emitting layers are stacked, it is advan-tageous in that the light efficiency increases and the lifespan of the display device increases.

The first charge generation layer CGL1 may be positioned between the first stack ST1 and the second stack ST2. The first charge generation layer CGL1 may serve to allow electric charge to be injected into each light emitting layer. The first charge generation layer CGL1 may serve to control charge balance between the first stack ST1 and the second stack ST2. The first charge generation layer CGL1 may include an n-type charge generation layer CGL11 and a p-type charge generation layer CGL12. The p-type charge generation layer CGL12 may be disposed on the n-type charge generation layer CGL11, and between the n-type charge generation layer CGL11 and the second stack ST2.

The first charge generation layer CGL1 may have a structure in which the n-type charge generation layer CGL11 and the p-type charge generation layer CGL12 are in contact with each other. The n-type charge generation layer CGL11 is disposed closer to the anode electrodes AE1, AE2 (see FIG. 5), and AE3 (see FIG. 5) than the cathode electrode CE.

The p-type charge generation layer CGL12 is disposed closer to the cathode electrode CE than each of the anode electrodes AE1, AE2 (see FIG. 5), and AE3 (see FIG. 5). The n-type charge generation layer CGL11 supplies electrons to the first light emitting layer EML1 adjacent to the anode electrodes AE1, AE2 (see FIG. 5), and AE3 (see FIG. 5), and the p-type charge generation layer CGL12 supplies holes to the second light emitting layer EML2 included in the second stack ST2. The first charge generation layer CGL1 is disposed between the first stack ST1 and the second stack ST2 to provide electric charge to each light emitting layer, thereby increasing luminous efficiency and decreasing a driving voltage.

The first stack ST1 may be positioned on the first anode electrode AE1, the second anode electrode AE2 (see FIG. 5), and the third anode electrode AE3 (see FIG. and may further include a first hole transport layer HTL1, a first electron block layer BILL and a first electron transport layer ETL1.

The first hole transport layer HTL1 may be positioned on the first anode electrode AE1, the second anode electrode AE2 (see FIG. 5), and the third anode electrode AE3 (see FIG. 5). The first hole transport layer HTL1 serves to facilitate the transport of holes and may include a hole transport material. The hole transport material may include a carbazole-based derivative such as N-phenylcarbazole and polyvinylcarbazole, a fluorene-based derivative, a triphenylamine-based derivative such as N,N'-bis(3-methylphenyl)-N,N'-diphenyl)-[1,1-biphenyl]-4,4'-diamine ("TPD") and 4,4',4"-tris(N-carbazolyl)triphenylamine (TCTA), N,N'-di(1-naphthyl)-N,N'-diphenylbenzidine ("NPB"), 4,4'-Cyclohexylidene bis[N,N-bis(4-methylphenyl)benzenamine] ("TAPC"), or the like, but the present disclosure is not limited thereto. In some embodiments, the first hole transport layer HTL1 may be formed as a single layer. Alternatively, in some embodiments, the first hole transport layer HTL1 may be formed as a plurality of layers. When the first hole transport layer HLT1 is formed as a plurality of layers, each layer may include a different material.

The first electron block layer BIL1 may be positioned on the first hole transport layer HTL1, and between the first hole transport layer HTL1 and the first light emitting layer EML1. The first electron block layer BIL1 may include a hole transport material and a metal or metal compound to prevent electrons generated in the first light emitting layer EML1 from moving into the first hole transport layer HTL1. In some embodiments, the first hole transport layer HTL1 and the first electron block layer BIL1 described above may be formed as a single layer in which respective materials are mixed. However, the present disclosure is not limited thereto. In some other embodiments, the first electron block layer BIL1 may be omitted.

The first electron transport layer ETL1 may be positioned on the first light emitting layer EML1, and between the first charge generation layer CGL1 and the first light emitting layer EML1. In some embodiments, the first electron transport layer ETL1 may include an electron transport material such as tris(8-hydroxyquinolinato)aluminum (Alq3), 1,3,5-tri(1-phenyl-1H-benzo[diimidazol-2-yl]phenyl (TPBi), 2,9-dimethyl-4,7-diphenyl-1,10-phenanthroline ("BCP"), (4,7-diphenyl-1,10-phenanthroline (Bphen), 3-(4-Biphenylyl)-4-phenyl-5-tert-butylphenyl-1,2,4-triazole ("TAZ"), 4-(Naphthalen-1-yl)-3,5-diphenyl-4H-1,2,4-triazole ("NTAZ"), 2-(4-Biphenylyl)-5-(4-tert-butylphenyl)-1,3,4-oxadiazole (tBu-PBD), bis(2-methyl-8-quinolinolato-N1, O8)-(1,1'-Biphenyl-4-olato)aluminum (BAlq), berylliumbis (benzoquinolin-10-olate (Bebq2), 9,10-di(naphthalene-2-yl) anthracene (ADN), and a mixture thereof. However, the present disclosure is not limited to the type of the electron transport material. In some embodiments, the first electron transport layer ETL1 may be formed as a single layer. Alternatively, in some embodiments, the first electron transport layer ETL1 may be formed as a plurality of layers. When the first electron transport layer ETL1 may be formed as a plurality of layers, each layer may include a different material. The second stack ST2 may be positioned on the first charge generation layer CGL1, and may further include a second hole transport layer HTL2, a second electron block layer BIL2, and a second electron transport layer ETL1.

The second hole transport layer HTL2 may be positioned on the first charge generation layer CGL1. The second hole transport layer HTL2 may be made of the same material as the first hole transport layer HTL1, or may include one or more materials selected from examples of materials included in the first hole transport layer HTL1. The second hole transport layer HTL2 may be formed as a single layer or a plurality of layers. When the second hole transport layer HTL2 is formed as a plurality of layers, each layer may include a different material.

The second electron block layer BIL2 may be positioned on the second hole transport layer HTL2, and between the second hole transport layer HTL2 and the first light emitting layer EML2. The second electron block layer BIL2 may be formed of the same material and the same structure as the first electron block layer BILL or may include one or more materials selected from examples of materials included in the first electron block layer BILL In some embodiments, the second electron block layer BIL2 may be omitted.

The second electron transport layer ETL2 may be positioned on the second light emitting layer EML2, and between the second charge generation layer CGL2 and the second light emitting layer EML2. The second electron transport layer ETL2 may be formed of the same material and the same structure as the first electron transport layer ETL1, or may include one or more materials selected from examples of materials included in the first electron transport layer ETL1. The second electron transport layer ETL2 may be formed as a single layer or a plurality of layers. When the second electron transport layer ETL2 is formed as a plurality of layers, each layer may include a different material.

The second charge generation layer CGL2 may be positioned on the second stack ST2 and between the second stack ST2 and the third stack ST3.

The second charge generation layer CGL2 may have the same structure as the first charge generation layer CGL1 described above. For example, the second charge generation layer CGL2 may include an n-type charge generation layer CGL21 disposed closer to the second stack ST2 and a p-type charge generation layer CGL22 disposed closer to the cathode electrode CE. The p-type charge generation layer CGL22 may be disposed on the n-type charge generation layer CGL21.

The second charge generation layer CGL2 may have a structure in which the n-type charge generation layer CGL21 and the p-type charge generation layer CGL22 are in contact with each other. The first charge generation layer CGL1 and the second charge generation layer CGL2 may be made of different materials, or may be made of the same material.

The second stack ST2 may be positioned on the second charge generation layer CGL2, and may further include a third hole transport layer HTL3 and a third electron transport layer ETL3.

The third hole transport layer HTL3 may be positioned on the second charge generation layer CGL2. The third hole transport layer HTL3 may be made of the same material as the first hole transport layer HTL1, or may include one or more materials selected from examples of materials included in the first hole transport layer HTL1. The third hole transport layer HTL3 may be formed as a single layer or a plurality of layers. When the third hole transport layer HTL3 is formed as a plurality of layers, each layer may include a different material.

The third electron transport layer ETL3 may be positioned on the third light emitting layer EML3, and between the cathode electrode CE and the third light emitting layer EML3. The third electron transport layer ETL3 may be formed of the same material and the same structure as the first electron transport layer ETL1, or may include one or more materials selected from examples of materials included in the first electron transport layer ETL1. The third electron transport layer ETL3 may be formed as a single layer or a plurality of layers. When the third electron transport layer ETL3 is formed as a plurality of layers, each layer may include a different material.

Although not shown in the drawings, a hole injection layer ("HIL") may be further positioned at least one of between the first stack ST1 and the first anode electrode AE1, between the second anode electrode AE2 (see FIG. 5) and the third anode electrode AE3 (see FIG. 5), between the second stack ST2 and the first charge generation layer CGL1, or between the third stack ST3 and the second charge generation layer CGL2. The hole injection layer may serve to allow holes to be more smoothly injected into the first light emitting layer EML1, the second light emitting layer EML2, and the third light emitting layer EML3. In some embodiments, the hole injection layer may be made of one or materials selected from the group consisting of cupper phthalocyanine (CuPc), poly(3,4)-ethylenedioxythiophene ("PEDOT"), polyaniline ("PANI"), and N,N-dinaphthyl-N, N'-diphenyl benzidine ("NPD"), but the present disclosure is not limited thereto. In some embodiments, the hole injection layer may be positioned between the first stack ST1 and the first anode electrode AE1, between the second anode electrode AE2 (see FIG. 5) and the third anode electrode AE3 (see FIG. 5), between the second stack ST2 and the first charge generation layer CGL1, and between the third stack ST3 and the second charge generation layer CGL2.

Although not shown in the drawings, an electron injection layer ("EIL") may be further positioned at least one of: between the third electron transport layer ETL3 and the cathode electrode CE, between the second charge generation layer CGL2 and the second stack ST2, or between the first charge generation layer CGL1 and the first stack ST1. The electron injection layer serves to facilitate electron injection, and may be made of tris(8-hydroxyquinolino)aluminum (Alq3), PBD, TAZ, spiro-PBD, BAlq, or SAlq, but the present disclosure is not limited thereto. Further, the electron injection layer may be a metal halide compound, and may include one or more materials selected from the group consisting of MgF2, LiF, NaF, KF, RbF, CsF, FrF, LiI, NaI, KI, RbI, CsI, FrI and CaF2, but the present disclosure is not limited thereto. Further, the electron injection layer may include a lanthanum-based material such as Yb, Sm, Eu, or the like. Alternatively, the electron injection layer may include both the metal halide material and the lanthanum-based material, such as RbI:Yb, KI:Yb, or the like. When the electron injection layer includes both the metal halide material and the lanthanum-based material, the electron injection layer may be formed by co-deposition of the metal halide material and the lanthanum-based material. In some embodiments, the electron injection layer may be positioned between the third electron transport layer ETL3 and the cathode electrode CE, between the second charge generation layer CGL2 and the second stack ST2, and between the first charge generation layer CGL1 and the first stack ST1.

The light emitting layer OL may have a modified structure in addition to the above-described structure. For example, the light emitting layer OL may include only two stacks or may include four or more stacks.

Referring again to FIG. 5, a thin film encapsulation layer 170 is disposed on the cathode electrode CE. The thin film encapsulation layer 170 is commonly disposed in the first emission area LA1, the second emission area LA2, the third emission area LA3, and the non-emissive area NLA. In some embodiments, the thin film encapsulation layer 170 directly covers the cathode electrode CE. In some embodiments, a capping layer (not shown) covering the cathode electrode CE may be further disposed between the thin film encapsulation layer TFE and the cathode electrode CE. In this case, the thin film encapsulation layer TFE may directly cover the capping layer.

In some embodiments, the thin film encapsulation layer 170 may include a first encapsulation inorganic layer 171, an encapsulation organic layer 173 and a second encapsulation inorganic layer 175 sequentially stacked on the cathode electrode CE.

In some embodiments, each of the first encapsulation inorganic layer 171 and the second encapsulation inorganic layer 175 may be formed of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), lithium fluoride or the like.

In some embodiments, the encapsulation organic layer 173 may be formed of acrylic resin, methacrylic resin, polyisoprene, vinyl resin, epoxy resin, urethane resin, cellulose resin, perylene resin or the like.

However, the structure of the thin film encapsulation layer 170 is not limited to the above-described example. In addition, the stacked structure of the thin film encapsulation layer 170 may be variously changed.

A first light blocking member 190 may be located on the thin film encapsulation layer 170. The first light blocking member 190 may be located on the thin film encapsulation layer 170 and located in the non-emission area NLA. The first light blocking member 190 may prevent light interference between adjacent emission areas, which causes color mixture, thereby further improving color reproducibility.

In some embodiments, the first light blocking member 190 may be disposed in the non-emission area NLA to surround each of the emission areas LA1, LA2, and LA3 in plan view.

The first light blocking member 190 may include an organic light blocking material, and may be formed through a coating and exposure process of an organic light blocking material.

Hereinafter, the color conversion substrate 30 will be described with further reference to FIGS. 10 to 14 in addition to FIGS. 5 and 7 to 9.

Figure 10:
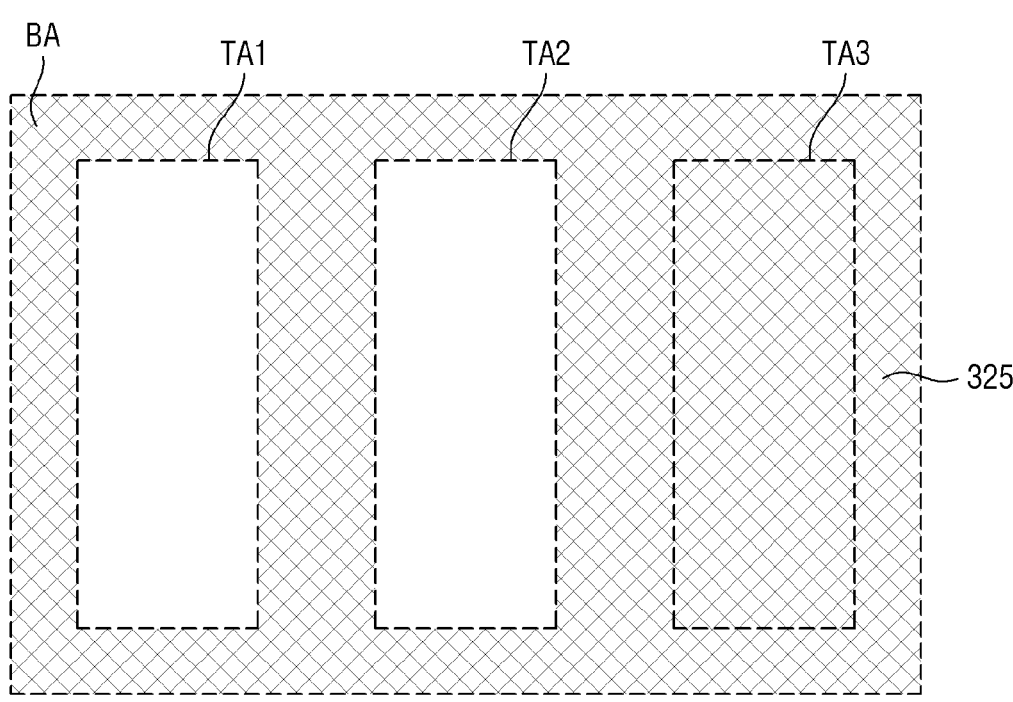
FIG. 10 is a plan view illustrating a schematic arrangement of a third color filter in a color conversion substrate of a display device according to one embodiment.
Figure 10:
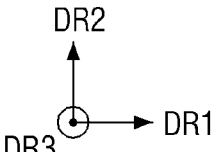
Figure 11:
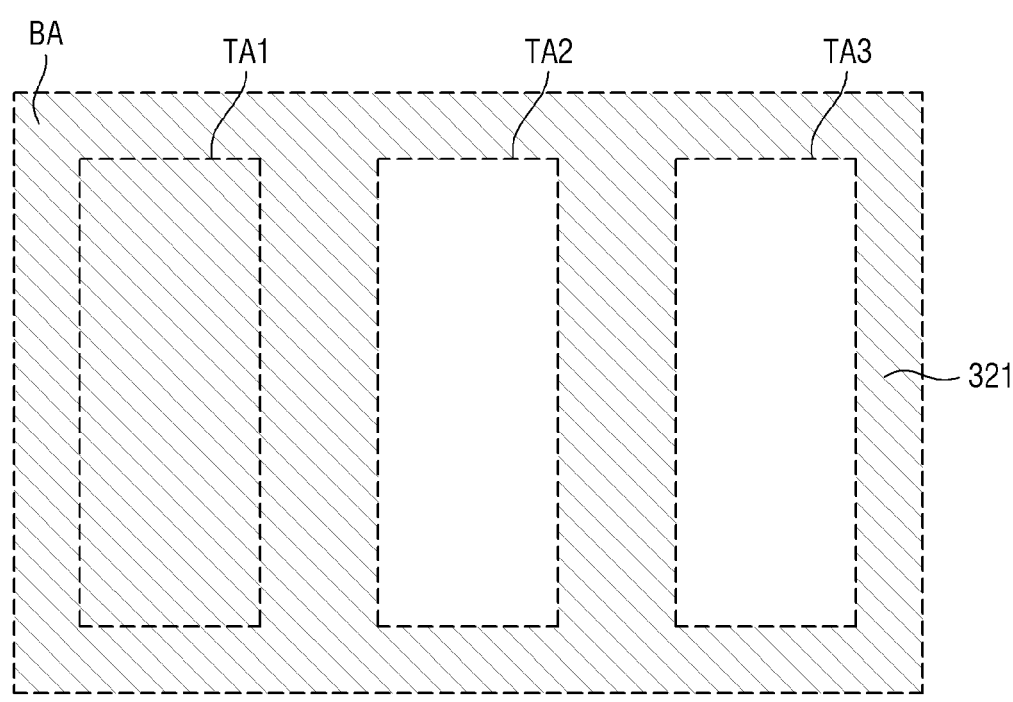
FIG. 11 is a plan view illustrating a schematic arrangement of a first color filter in a color conversion substrate of a display device according to one embodiment.
Figure 11:
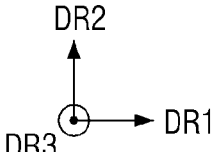
Figure 12:
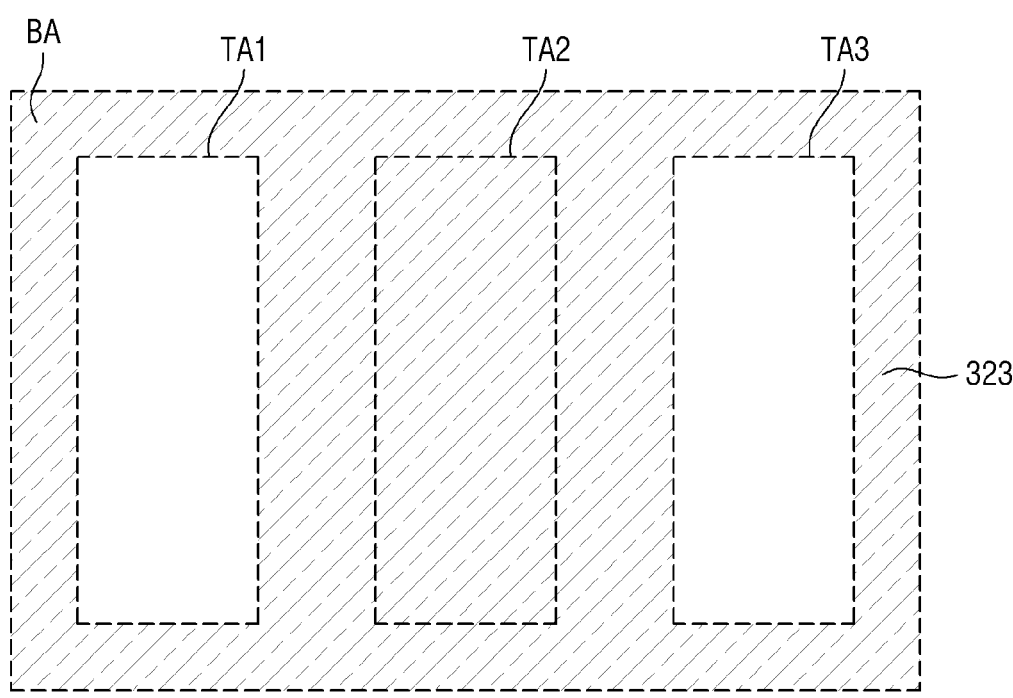
FIG. 12 is a plan view illustrating a schematic arrangement of a second color filter in a color conversion substrate of a display device according to one embodiment.
Figure 12:
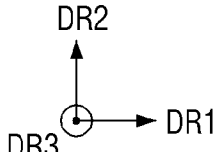
Figure 13:
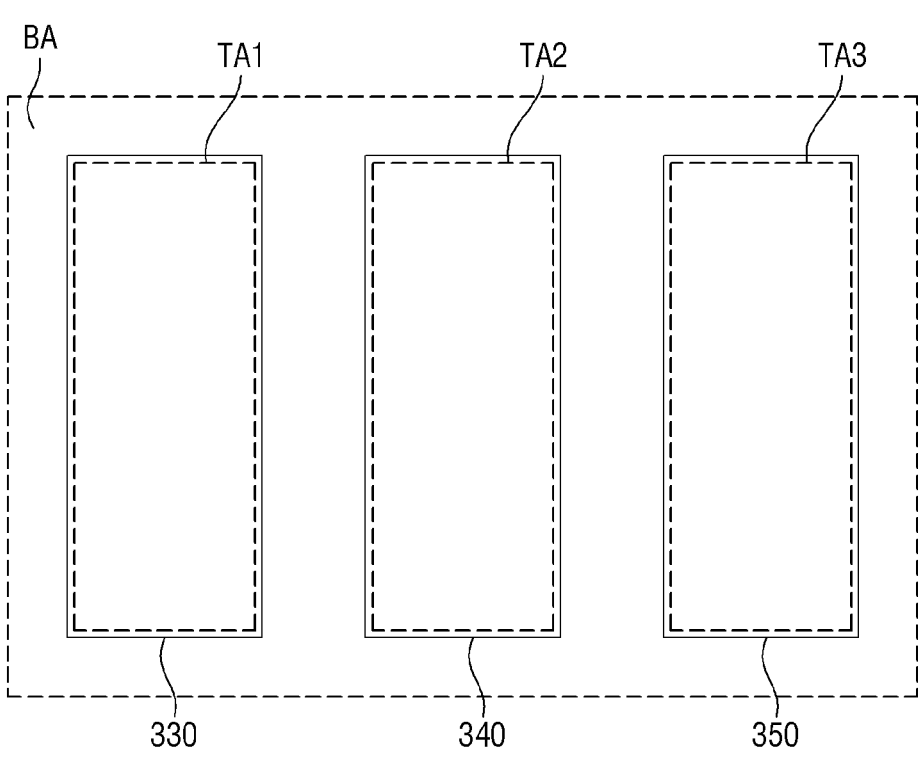
FIG. 13 is a plan view schematically illustrating the arrangement of a first wavelength conversion pattern, a second wavelength conversion pattern, and a light transmission pattern on a color conversion substrate of a display device according to one embodiment.
Figure 13:
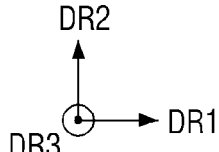
Figure 14:
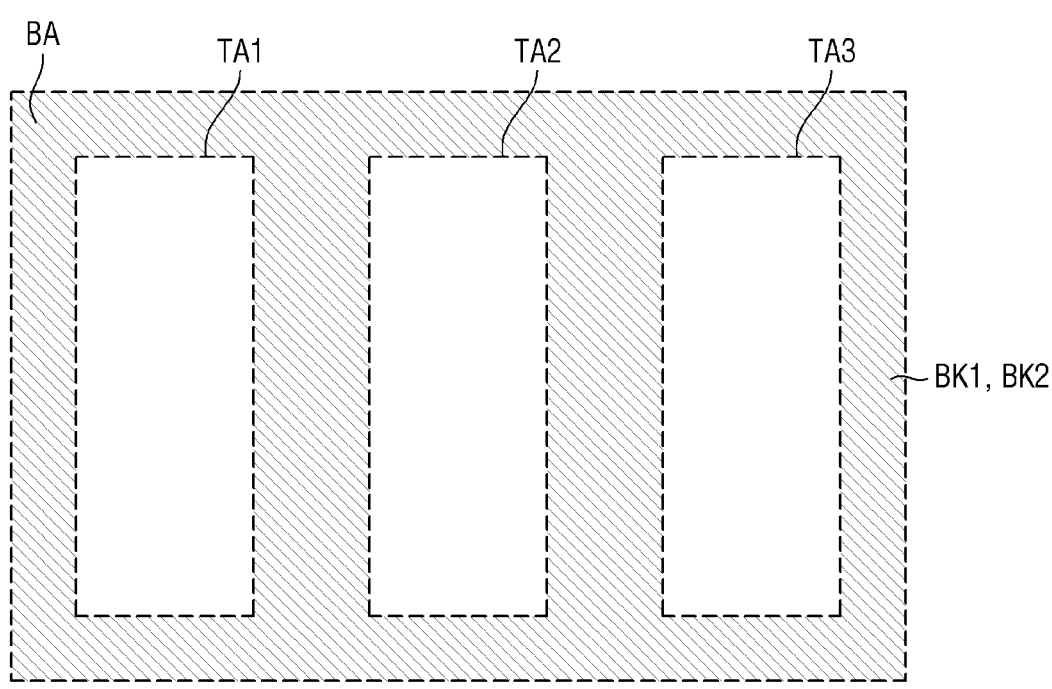
FIG. 14 is a plan view schematically illustrating the arrangement of a first bank and a second bank in a color conversion substrate of a display device according to one embodiment.
Figure 14:
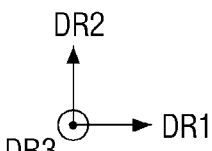

FIG. 10 is a plan view illustrating a schematic arrangement of a third color filter in a color conversion substrate of a display device according to one embodiment. FIG. 11 is a plan view illustrating a schematic arrangement of a first color filter in a color conversion substrate of a display device according to one embodiment. FIG. 12 is a plan view illustrating a schematic arrangement of a second color filter in a color conversion substrate of a display device according to one embodiment. FIG. 13 is a plan view schematically illustrating the arrangement of a first wavelength conversion pattern, a second wavelength conversion pattern, and a light transmission pattern on a color conversion substrate of a display device according to one embodiment. FIG. 14 is a plan view schematically illustrating the arrangement of a first bank and a second bank in a color conversion substrate of a display device according to one embodiment.

Referring to FIGS. 5 and 7 to 14, a second base substrate 310 may be made of a light transmitting material. In some embodiments, the second base substrate 310 may include a glass substrate or a plastic substrate. In some embodiments, the second base substrate 310 may further include a separate layer, for example, an insulating layer such as an inorganic layer, located on the glass substrate or the plastic substrate.

As described above, in some embodiments, a plurality of light transmitting areas TA1, TA2, and TA3 and a light blocking area BA may be defined in the second base substrate 310 as shown in FIG. 4.

Color filters 321, 323, and 325 may be disposed on one surface of the second base substrate 310 facing the display substrate 10.

A first color filter 321 may be located in the first light transmitting area TA1, a second color filter 323 may be located in the second light transmitting area TA2, and a third color filter 325 may be located in the third light transmitting area TA3.

The first color filter 321 may selectively transmit light of the second color (e.g., red light) and may block or absorb light of the first color (e.g., blue light) and light of the third color (e.g., green light). In some embodiments, the first color filter 321 may be a red color filter, and may include a red colorant such as a red dye or a red pigment. In the present specification, the colorant is the concept including both a dye and a pigment.

The second color filter 323 may selectively transmit light of the third color (e.g., green light) and may block or absorb light of the first color (e.g., blue light) and light of the second color (e.g., red light). In some embodiments, the second color filter 323 may be a green color filter, and may include a green colorant such as a green dye or a green pigment.

The third color filter 325 may selectively transmit light of the first color (e.g., blue light) and may block or absorb light of the second color (e.g., red light) and light of the third color (e.g., green light). In some embodiments, the third color filter 325 may be a blue color filter, and may include a blue colorant such as a blue dye or a blue pigment.

Each of the color filters 321, 323, and 325 may be further disposed not only in the light transmitting areas TA1, TA2, and TA3, but also in the adjacent light blocking area BA.

As illustrated in FIGS. 10 to 12, the third color filter 325 may be further disposed in the light blocking area BA as well as the third light transmitting area TA3. The third color filter 325 may not be disposed in the first light transmitting area TA1 and the second light transmitting area TA2. The first color filter 321 may be further disposed in the light blocking area BA as well as the first light transmitting area TA1. The first color filter 321 may not be disposed in the second light transmitting area TA2 and the third light transmitting area TA3. The second color filter 323 may be further disposed in the light blocking area BA as well as the second light transmitting area TA2. The second color filter 323 may not be disposed in the first light transmitting area TA1 and the third light transmitting area TA3.

In the light blocking area BA, the color filters 321, 323, and 325 may be disposed to be overlapped in the thickness direction (i.e., third direction DR3).

In one embodiment, each of the color filters 321, 323, and 325 may be formed through a photolithography process.

First, a third color filter material layer may be entirely deposited on one surface of the second base substrate 310, and then be exposed and developed using a mask, and the patterned third color filter 325 may be formed in the third light transmitting area TA3 and the light blocking area BA. Next, a first color filter material layer may be entirely deposited on one surface of the second base substrate 310 and one surface of the third color filter 325, and be exposed and developed using a mask, and the patterned first color filter 321 may be formed in the first light transmitting area TA1 and the light blocking area BA. Subsequently, a second color filter material layer may be entirely deposited on one surface of the second base substrate 310 and one surface of the first color filter 321, and be exposed and developed using a mask, and the patterned second color filter 323 may be formed in the second light transmitting area TA2 and the light blocking area BA.

According to the illustrated deposition sequence, a stacked structure of the third color filter 325, the first color filter 321, and the second color filter 323 may be formed on one surface of the second base substrate 310 in the light blocking area BA. According to the stacked structure, the third color filter 325 may be in direct contact with one surface of the second base substrate 310 in the third light transmitting area TA3 and the light blocking area BA, the first color filter 321 may be in direct contact with one surface of the second base substrate 310 in the first light transmitting area TA1 and be in contact with one surface of the third color filter 325 in the light blocking area BA, and the second color filter 323 may be in direct contact with one surface of the second base substrate 310 in the second light transmitting area TA2 and be in contact with one surface of the first color filter 321 in the light blocking area BA.

In one embodiment, each of the color filters 321 and 323 of the first light transmitting area TA1 and the second light transmitting area TA2 may include stepped portions (or depressed portions) recessed toward the second base substrate 310. On the other hand, since the third color filter 325 of the third light transmitting area TA3 is formed on one surface of the second base substrate 310 before the other color filters 321 and 323, stepped portions (or depressed portions) may not be included in the first and second color filters 321 and 323.

However, the deposition order of each of the color filters 321, 323, and 325 is not limited thereto and may be variously modified. As the deposition order of each of the color filters 321, 323, and 325 is modified, the stacked structure of each of the color filters 321, 323, and 325 in the light blocking area BA and the shape of each of the color filters 321, 323, and 325 in the light transmitting areas TA1, TA2, and TA3 may be modified, so that a detailed description thereof will be omitted.

Each of the color filters 321, 323, and 325 stacked in the light blocking area BA may together function as a light blocking member. Specifically, each of the color filters 321, 323, and 325 stacked in the light blocking area BA may absorb a part of light introduced from the outside of the display device 1 to the color conversion substrate 30 and reduce reflected light caused by external light.

A first bank BK1 may be disposed between the stacked structure of each of the color filters 321, 323, and 325 and the filling layer 70 in the light blocking area BA. In one embodiment, the first bank BK1 may be in direct contact with one surface of the second color filter 323. The first bank BK1 may be disposed to overlap the light blocking area BA and may not be disposed to overlap each of the light transmitting areas TA1, TA2, and TA3. As illustrated in FIG.

14, the first bank BK1 may completely surround each of the light transmitting areas TA1, TA2, and TA3 in plan view.

In some embodiments, the first bank BK1 may include an organic insulating material selected from the group consisting of acrylic resin, epoxy resin, phenolic resin, polyamide resin, polyimide resin, unsaturated polyester resin, polyphenylene ether resin, polyphenylenesulfide resin and benzocyclobutene (BCB).

The first bank BK1 may serve to absorb light of the first color or light of the third color. For example, the first bank BK1 may be a light blocking member.

Each of the light transmitting areas TA1, TA2, and TA3 between the adjacent light blocking areas BA may be surrounded by the first banks BK1 disposed in the adjacent light blocking area BA to form a first depressed portion (or puddle). In the present specification, the first depressed portion may mean a space up to the corresponding color filters 321, 323, and 325 recessed toward the second base substrate 310 from the extended surface of the bottom surface of the first bank BK1 in each of the light transmitting areas TA1, TA2, and TA3.

A first low refractive index layer LRL1 may be disposed between the corresponding color filters 321, 323, and 325 in the light transmitting areas TA1, TA2, and TA3 and between the first bank BK1 and the filling layer 70 in the light blocking area BA. The first low refractive index layer LRL1 may be disposed over each of the light transmitting areas TA1, TA2, and TA3 and the light blocking area BA. Since the first low refractive index layer LRL1 is formed later than the first bank BK1 described above, the first low refractive index layer LRL1 may not be in contact with the stacked structure of the color filters 321, 323, and 325 in the light blocking area BA.

In each of the light transmitting areas TA1, TA2, and TA3, the first low refractive index layer LRL1 may be in direct contact with the corresponding color filters 321, 323, and 325. The first low refractive index layer LRL1 may be in contact with the first color filter 321 in the first light transmitting area TA1, the first low refractive index layer LRL1 may be in contact with the second color filter 323 in the second light transmitting area TA2, and the first low refractive index layer LRL1 may be in contact with the third color filter 325 in the third light transmitting area TA3.

The first low refractive index layer LRL1 may cover the bottom surface and the side surface of the first bank BK1.

The first low refractive index layer LRL1 may include hollow inorganic particles and an organic material in which the hollow inorganic particles are dispersed. The organic material may be an insulating resin. The inorganic particles may include silica ($SiO_2$), magnesium fluoride ($MgF_2$), or iron oxide ($Fe_3O_4$). The inorganic particle may include a shell made of any of the exemplified materials, and a hollow defined inside the shell.

The refractive index of the first low refractive index layer LRL1 may be smaller than each of the refractive indexes (having a second refractive index range) of the adjacent color filters 321, 323, and 325, and the wavelength conversion patterns 330 and 340 and the light transmission pattern 350 to be described. For example, the first low refractive index layer LRL1 may have a first refractive index range. The first refractive index range may be about 1.3 to about 1.4.

The first low refractive index layer LRL1 may be formed not only on the first bank BK1 but also on the first depressed portion (or puddle) surrounded by the first banks BK1. The first low refractive index layer LRL1 includes the organic material as described above, and thus although the first low refractive index layer LRL1 is uniformly formed on the bottom surface, the side surface, and the first depressed portion of the first bank BK1, the first low refractive index layer LRL1 formed on the bottom surface and the side surfaces of the first bank BK1 may flow into the first depressed portion, so that the first low refractive index layer LRL1 may have a different thickness for each area.

Figure 15:
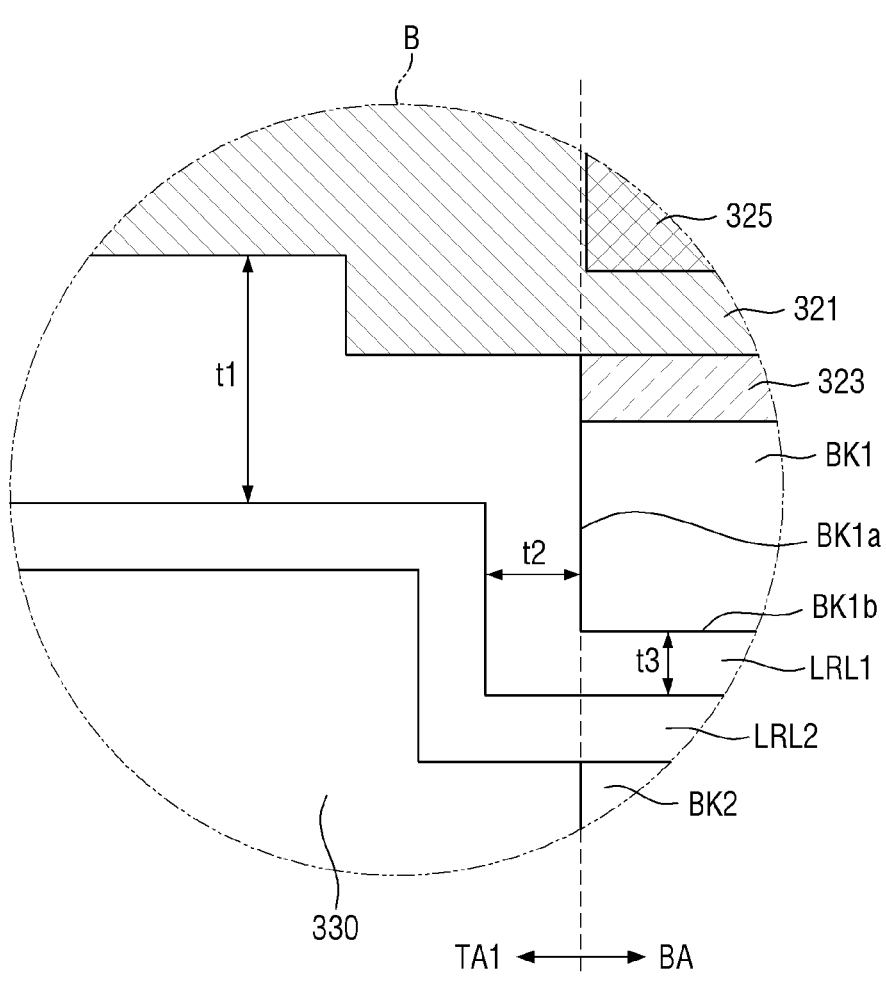
FIG. 15 is an enlarged cross-sectional view of area B of FIG. 5.

FIG. 15 is an enlarged cross-sectional view of area B of FIG. 5.

Referring to FIGS. 5 and 15 together, the first low refractive index layer LRL1 on the first color filter 321 of the first light transmitting area TA1 may have a first thickness t1 in the third direction DR3, the first low refractive index layer LRL1 may have a second thickness t2 in the first direction DR1 on a side surface BK1a of the first bank BK1, and the first low refractive index layer LRL1 may have a third thickness t3 in the third direction DR3 on a bottom surface BK1b of the first bank BK1 (in the light blocking area BA). In the present specification, the first thickness t1 may mean the largest thickness of the first low refractive index layer LRL1 in the third direction DR3 on each of the color filters 321, 323, and 325 in the corresponding light transmitting areas TA1, TA2, and TA3, the second thickness t2 may mean the largest thickness of the first low refractive index layer LRL1 in the first direction DR1 on the side surface BK1a of the first bank BK1, and the third thickness t3 may mean the largest thickness of the first low refractive index layer LRL1 in the third direction DR3 on the bottom surface BK1b of the first bank BK1.

The first thickness t1 of the first low refractive index layer LRL1 may be greater than each of the second thickness t2 and the third thickness t3. For example, the first thickness t1 may be at least five times greater than the third thickness t3. For example, the first thickness t1 may be about 25 micrometers (μm), and the third thickness t3 may be about 5 μm. In addition, the second thickness t2 may be equal to, smaller than, or larger than the third thickness t3.

As will be described later, the wavelength conversion patterns 330 and 340 convert the light of the first color provided from the display substrate 10 into the light of the second color and the light of the third color, respectively, and when the light that is not color-converted by the wavelength conversion patterns 330 and 340 is emitted to the outside of the display device 1, color purity may deteriorate. The first low refractive index layer LRL1 has a refractive index smaller than the refractive index of the wavelength conversion patterns 330 and 340, and thus induces total reflection, at the interface of the first low refractive index layer LRL1 and the wavelength conversion patterns 330 and 340, of light that is not color-converted by the wavelength conversion patterns 330 and 340, so that wavelength conversion efficiency may be increased.

A second low refractive index layer LRL2 may be disposed on the first low refractive index layer LRL1. The second low refractive index layer LRL2 may be disposed over each of the light transmitting areas TA1, TA2, and TA3 and the light blocking area BA. The second low refractive index layer LRL2 may cover the bottom surface and the side surface of the first bank BK1. The second low refractive index layer LRL2 may conformally reflect the surface stepped portion of the first low refractive index layer LRL1.

The second low refractive index layer LRL2 may include an inorganic material. Examples of the inorganic material of the second low refractive index layer LRL2 may include silicon oxide, silicon nitride, aluminum oxide, or the like, but are not limited thereto. The second low refractive index layer LRL2 may cover the first low refractive index layer LRL1 to perform a capping function to prevent the first low refractive index layer material from flowing to the outside.

The second low refractive index layer LRL2 may have a third refractive index range. The third refractive index range of the second low refractive index layer LRL2 may be about 1.2 to about 1.3. The second low refractive index layer LRL2 may have a refractive index smaller than the second refractive index range of the wavelength conversion patterns 330 and 340 and the light transmission pattern 350. The second low refractive index layer LRL2 may further include fluorine F to have a third refractive index range. In some embodiments, the second low refractive index layer LRL2 may be formed through various methods well known in related art to have a third refractive index range. The third refractive index of the second low refractive index layer LRL2 may be less than or equal to the first refractive index of the first low refractive index layer LRL1.

The second low refractive index layer LRL2 may be in direct contact with the first low refractive index layer LRL1.

The second low refractive index layer LRL2 has a refractive index smaller than the refractive index of the wavelength conversion patterns 330 and 340, and thus induces total reflection, at the interface of the second low refractive index layer LRL2 and the wavelength conversion patterns 330 and 340, of light that is not color-converted by the wavelength conversion patterns 330 and 340, so that wavelength conversion efficiency may be increased.

A second bank BK2 may be disposed between the second low refractive index layer LRL2 and the filling layer 70 in the light blocking area BA. The second bank BK2 may be disposed to overlap the light blocking area BA and may not be disposed to overlap each of the light transmitting areas TA1, TA2, and TA3 in a plan view.

The second bank BK2 may include at least one of the materials exemplified in the first bank BK1. In one embodiment, the second bank BK2 may further include a liquid repellent material as well as at least one of the materials exemplified above. In some embodiments, the liquid repellent material may be dispersed and disposed inside the exemplified material of the second bank BK2. In some other embodiments, the liquid repellent material may be formed by being coated on the surface of the second bank BK2 (the bottom surface facing the filling layer 70 and the side surfaces facing the adjacent light transmitting areas TA1, TA2, and TA3). The liquid repellent material of the second bank BK2 may include fluorine, silane, a gelling agent, or silica, but is not limited thereto.

The second bank BK2 may serve to absorb light of the first color or light of the third color. For example, the second bank BK2 may be a light blocking member.

As illustrated in FIG. 14, the second bank BK2 may completely surround each of the light transmitting areas TA1, TA2, and TA3 in plan view. The second bank BK2 may be disposed to overlap the first bank BK1 in the thickness direction (i.e., the third direction DR3).

Each of the light transmitting areas TA1, TA2, and TA3 may be surrounded by the second banks BK2 disposed in the adjacent light blocking area BA to form a second depressed portion (or puddle). In the present specification, the second depressed portion may mean a space up to one surface of the second low refractive layer LRL2 recessed toward the second base substrate 310 from the extended surface of the bottom surface of the second bank BK2 in each of the light transmitting areas TA1, TA2, and TA3.

The first wavelength conversion pattern 330, the second wavelength conversion pattern 340, and the light transmission pattern 350 may be positioned on the bottom surface of the second low refractive index layer LRL2 in each of the light transmitting areas TA1, TA2, and TA3.

In one embodiment, the first wavelength conversion pattern 330, the second wavelength conversion pattern 340, and the light transmission pattern 350 may be formed by an inkjet method.

The first wavelength conversion pattern 330 may be disposed in the first light transmitting area TA1, the second wavelength conversion pattern 340 may be disposed in the second light transmitting area TA2, and the light transmission pattern 350 may be disposed in the third light transmitting area TA3. Each of the wavelength conversion patterns 330 and 340 and the light transmission pattern 350 may be disposed in the second depressed portion (or puddle) formed by the second bank BK2. Each of the wavelength conversion patterns 330 and 340 and the light transmission pattern 350 may be in direct contact with one surface of the second low refractive index layer LRL2 exposed by the second bank BK2 and side surfaces of the second bank BK2. The first bank BK1 and the second bank BK2 may function as a partition wall to prevent the wavelength conversion pattern material and the light transmission pattern material from overflowing to neighboring pixels when each of the wavelength conversion patterns 330 and 340 and the light transmission pattern 350 are formed by an inkjet method. The first bank BK1 may serve to increase the depth of the second depressed portion by being disposed between the second bank BK2 and the second base substrate 310.

As described above, the second bank BK2 may include a liquid repellent material, and thus may prevent the light transmission pattern material and the wavelength conversion pattern materials from flowing outside the corresponding light transmitting areas TA1, TA2, and TA3 when the light transmission pattern 350 and each of the wavelength conversion patterns 330 and 340 are formed by the inkjet method.

As illustrated in FIG. 13, the wavelength conversion patterns 330 and 340 and the light transmission pattern 350 may have an island shape.

The first wavelength conversion pattern 330 may convert or shift incident light having a predetermined peak wavelength into light having a different peak wavelength and emit the light. In some embodiments, the first wavelength conversion pattern 330 may convert the light of the first color provided from the first light emitting element ED1 into light of the second color (red light, La) having a peak wavelength in a range of about 610 nm to about 650 nm and emit the light In some embodiments, the first wavelength conversion pattern 330 may include a first base resin 331 and a first wavelength shifter 333 dispersed in the first base resin 331, and may further include scattering particles SC dispersed in the first base resin 331.

The first base resin 331 may be made of a material having high light transmittance. In some embodiments, the first base resin 331 may be formed of an organic material. For example, the first base resin 331 may include an organic material such as epoxy resin, acrylic resin, or imide resin.

The first wavelength shifter 333 may convert or shift the peak wavelength of incident light to another specific peak wavelength. In some embodiments, the first wavelength shifter 333 may convert light of the first color, which is blue light, provided from the first light emitting element ED1 into red light of the second color (red light) having a single peak wavelength in a range of about 610 nm to about 650 nm, and may emit it.

Examples of the first wavelength shifter 333 may include a quantum dot, a quantum rod, a phosphor, and the like. For example, a quantum dot may be a particulate material that emits light of a specific color when an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include group IV nanocrystal, group II-VI compound nanocrystal, group III-V compound nanocrystal, group IV-VI nanocrystal, a combination thereof, or the like.

The group II-VI compound may be selected from the group consisting of binary compounds, ternary compounds, and quaternary compounds, wherein the binary compounds are selected from the group consisting of CdSe, CdTe, ZnS, ZnSe, ZnTe, ZnO, HgS, HgSe, HgTe, MgSe, MgS and mixtures thereof, the ternary compounds are selected from the group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof, and the quaternary compounds are selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The group III-V compound may be selected from the group consisting of binary compounds, ternary compounds, and quaternary compounds, wherein the binary compounds are selected from the group consisting of GaN, GaP, GaAs, GaSb, AlN, AlP, AlAs, AlSb, InN, InP, InAs, InSb and mixtures thereof, the ternary compounds are selected from the group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures thereof, and the quaternary compounds are selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The group IV-VI compound may be selected from the group consisting of binary compounds, ternary compounds, and quaternary compounds, wherein the binary compounds are selected from the group consisting of SnS, SnSe, SnTe, PbS, PbSe, PbTe and mixtures thereof, the ternary compounds are selected from the group consisting of SnSeS, SnSeTe, SnSTe, PbSeS, PbSeTe, PbSTe, SnPbS, SnPbSe, SnPbTe and mixtures thereof, and the quaternary compounds are selected from the group consisting of SnPbSSe, SnPbSeTe, SnPbSTe and mixtures thereof. The group IV element may be selected from the group consisting of Si, Ge and mixtures thereof. The group IV compound may be a binary compound selected from the group consisting of SiC, SiGe and mixtures thereof.

In this case, the binary compound, the tertiary compound or the quaternary compound may exist in particles at a uniform concentration, or may exist in the same particle divided into states where concentration distributions are partially different. Further, the particles may have a core/shell structure in which one quantum dot surrounds another quantum dot. An interface between the core and the shell may have a concentration gradient in which the concentration of elements present in the shell decreases toward the center.

In some embodiments, the quantum dot may have a core-shell structure including a core including the nanocrystal described above and a shell surrounding the core. The shell of the quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of elements present in the shell decreases toward the center. Examples of the shell of the quantum dot may include a metal or non-metal oxide, a semiconductor compound, and a combination thereof.

For example, the metal or non-metal oxide may be a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$ and $NiO$, or a tertiary compound such as $MgAl_2O_4$, $CoFe_2O_4$, $NiFe_2O_4$ and $CoMn_2O_4$, but the present disclosure is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb or the like, but the present disclosure is not limited thereto.

The second wavelength conversion pattern 340 may convert or shift incident light having a predetermined peak wavelength into light having a different peak wavelength and emit the light. In some embodiments, the second wavelength conversion pattern 340 may convert light of a first color provided from the second light emitting element ED2 into light of a third color (green light, Lb) in a range of about 510 nm to about 550 nm and emit the light.

In some embodiments, the second wavelength conversion pattern 340 may include a second base resin 341 and a second wavelength shifter 343 dispersed in the second base resin 341, and may further include the scattering particles SC dispersed in the second base resin 341.

The second base resin 341 may be made of a material having high light transmittance. In some embodiments, the second base resin 341 may be formed of an organic material. In some embodiments, the second base resin 341 may be made of the same material as the first base resin 331, or may include at least one of the materials exemplified as the constituent materials of the first base resin 331.

The second wavelength shifter 343 may convert or shift the peak wavelength of incident light to another specific peak wavelength. In some embodiments, the second wavelength shifter 355 may convert blue light having a peak wavelength in a range of about 440 nm to about 480 nm into green light having a peak wavelength in a range of about 510 nm to about 550 nm.

Examples of the second wavelength shifter 343 may include a quantum dot, a quantum rod, a phosphor, and the like. A more detailed description of the second wavelength shifter 343 is substantially the same as or similar to the description of the first wavelength shifter 333, and thus will be omitted.

In some embodiments, both the first wavelength shifter 333 and the second wavelength shifter 343 may be formed of quantum dots. In this case, the particle size of the quantum dots forming the first wavelength shifter 333 may be larger than the particle size of the quantum dots forming the second wavelength shifter 343.

The light transmission pattern 350 may transmit incident light. The light of the first color provided from the third light emitting element ED3 passes through the light transmission pattern 350 and the third color filter 325 and is emitted to the outside of the display device 1. Light Lc of a first color emitted from the third light transmitting area TA3 may be blue light.

In some embodiments, the light transmission pattern 350 may include a third base resin 351 and may further include the scattering particles SC dispersed in the third base resin 351.

The third base resin 351 may be made of a material having high light transmittance. A material of the third base resin 351 may be selected from the exemplified materials of the first base resin 331.

The scattering particles SC may have a refractive index different from a refractive index of the base resins 331, 341, and 351 and form an optical interface with each of the base resins 331, 341, and 351. The scattering particles SC may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The surfaces (bottom surfaces) of the light transmission pattern 350 and each of the wavelength conversion patterns 330 and 340 formed by the inkjet method may protrude from the bottom surface of the adjacent second bank BK2 in the thickness direction. In some embodiments, the surfaces (bottom surfaces) of the light transmission pattern 350 and each of the wavelength conversion patterns 330 and 340 formed by the inkjet method may be positioned at the same level as the bottom surface of the adjacent second bank BK2 or may be recessed in the thickness direction.

A first capping layer 360 may be positioned on the bottom surfaces of the light transmission pattern 350, each of the wavelength conversion patterns 330 and 340, and the second bank BK2. In some embodiments, the first capping layer 360 may be in contact with the bottom surfaces of the light transmission pattern 350, each of the wavelength conversion patterns 330 and 340, and the second bank BK2.

The first capping layer 360 may prevent the light transmission pattern 350, each of the wavelength conversion patterns 330 and 340, and the like from being damaged or contaminated by impurities such as moisture or air from the outside. In addition, the first capping layer 360 may serve to prevent materials constituting the light transmission pattern 350 and each of the wavelength conversion patterns 330 and 340 from moving to the adjacent light transmitting areas TA1, TA2, and TA3. In some embodiments, the first capping layer 360 may be made of an inorganic material. For example, the first capping layer 360 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or the like.

As described above, the filling layer 70 may be located in the space between the color conversion substrate 30 and the display substrate 10. In some embodiments, the filling layer 70 may be positioned between the first capping layer 360 and the thin film encapsulation layer 170 and between the first light blocking member 190 and the first capping layer 390. In some embodiments, the filling layer 70 may be in direct contact with the first capping layer 360, the thin film encapsulation layer 170, and the first light blocking member 190.

As described above, in the color conversion substrate 30 according to one embodiment, wavelength conversion efficiency may be increased in the corresponding light transmitting areas TA1 and TA2 through the low refractive index layers LRL1 and LRL2. Moreover, reflection of external light may be reduced through a positional relationship between the low refractive index layers LRL1 and LRL2 and the first bank BK1. A detailed description thereof will be given with further reference to FIG. 16.

Figure 16:
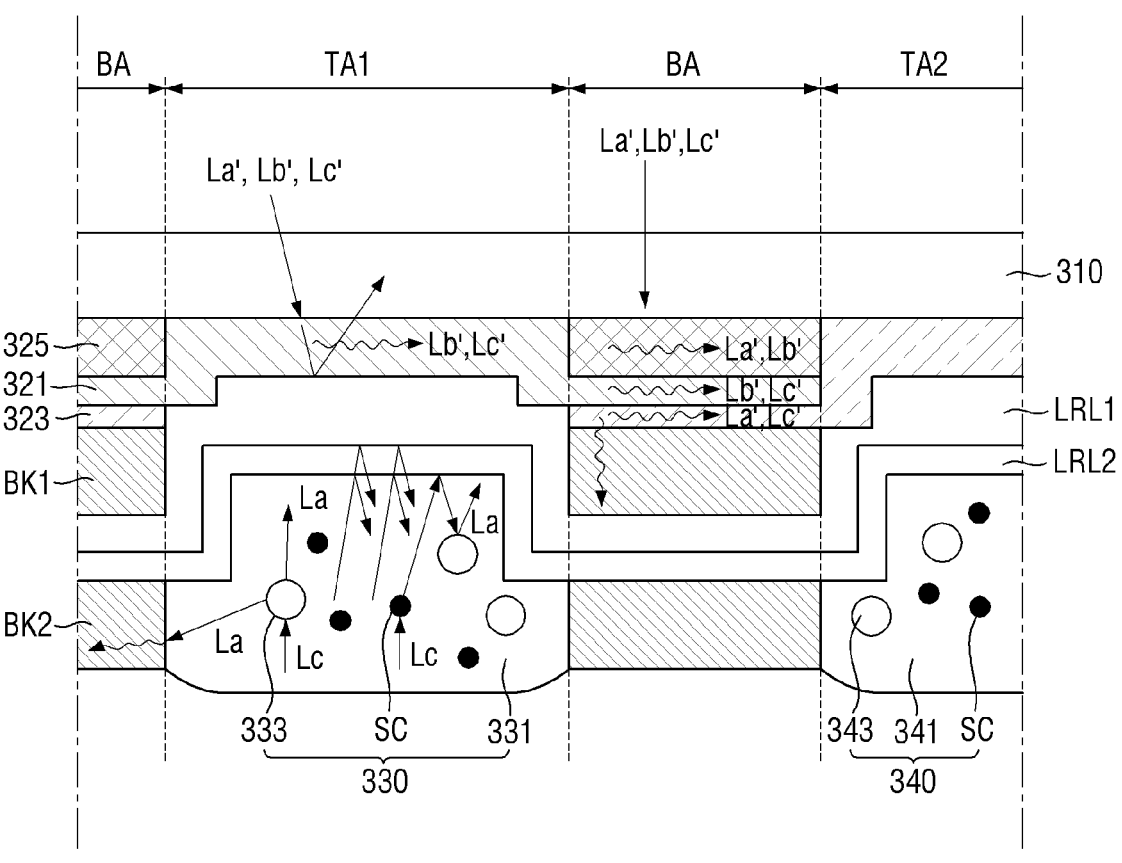
FIG. 16 is a schematic diagram of a display device according to one embodiment.

FIG. 16 is a schematic diagram of a display device according to one embodiment. In FIG. 16, various light paths in the first light transmitting area TA1, and external light reflection reduction in the light blocking area BA between the first light transmitting area TA1 and the second light transmitting area TA2 are exemplified. However, the contents described with reference to FIG. 16 may be also applied to various light paths in the second light transmitting area TA2 and external light reflection reduction in the light blocking area BA between the second light transmitting area TA2 and the third light transmitting area TA3 and in the light blocking area BA between the third light transmitting area TA3 and the first light transmitting area TA1.

Referring to FIGS. 5 and 16, the light Lc of the first color from the display substrate 10 may be provided to the first wavelength conversion pattern 330 of the first light transmitting area TA1. The light Lc of the first color may be wavelength-converted by the first wavelength shifter 333 to be wavelength-converted into the light La of the second color. The wavelength-converted light La of the second color by the first wavelength shifter 333 may enter the adjacent second bank BK2 or may enter the low refractive index layers LRL1 and LRL2. The light La of the second color entering the second bank BK2 may be absorbed by the second bank BK2, and thus light mixing with the adjacent light transmitting areas TA2 and TA3 may be prevented. Among the light La of the second color that is wavelength-converted by the first wavelength shifter 333, the light entering the second low refractive index layer LRL2 may enter into the second low refractive index layer LRL2 or may be reflected from the second low refractive index layer LRL2 back to the first wavelength conversion pattern 330 according to the incident angle at the interface between the second low refractive index layer LRL2 and the first wavelength conversion pattern 330. The light La of the second color entering into the second low refractive layer LRL2 may enter into the first low refractive layer LRL1 or be reflected back to the second low refractive index layer LRL2 according to the incident angle at the interface between the second low refractive layer LRL2 and the first low refractive layer LRL1.

On the other hand, among the light that is not wavelength-converted by the first wavelength shifter 333 among the light Lc of the first color, the light that is scattered by the scattering particles SC and incident on the low refractive index layers LRL1 and LRL2 or is not scattered by the scattering particles SC and directly incident on the low refractive index layers LRL1 and LRL2, may be reflected again and provided to the first wavelength conversion pattern 330 when the light is incident at an angle greater than the critical angle at the interface between the second low refractive index layer LRL2 and the first wavelength conversion pattern 330 or the interface between the second low refractive index layer LRL2 and the first low refractive index layer LRL1. Light that is reflected back and provided to the first wavelength conversion pattern 330 may be wavelength-converted by the first wavelength shifter 333 of the first wavelength conversion pattern 330. Accordingly, wavelength conversion efficiency in the first wavelength conversion pattern 330 may be increased.

Furthermore, although parts of lights La', Lb', and Lc' incident from the outside of the color conversion substrate 30 (the outside of the display device 1) in the light blocking area BA are absorbed by the third color filter 325, the first color filter 321, and the second color filter 323, respectively as illustrated in FIG. 16, the other parts may enter the first bank BK1. Light entering the first bank BK1 in the light blocking area BA may be absorbed by the first bank BK1. The color conversion substrate 30 according to one embodiment may have a structure in which the second base substrate 310, the color filters 325, 321, and 323, the first bank BK1, and the first low refractive index layer LRL1 are stacked from the top, so that it is possible to prevent the occurrence of reflection of external light due to the first low refractive index layer LRL1 positioned in the light blocking area BA in advance.

Hereinafter, other embodiments of the display device will be described. In the following embodiments, the same components as those of the above-described embodiment are denoted by the same reference numerals, and a description thereof will be omitted or simplified.

Figure 17:
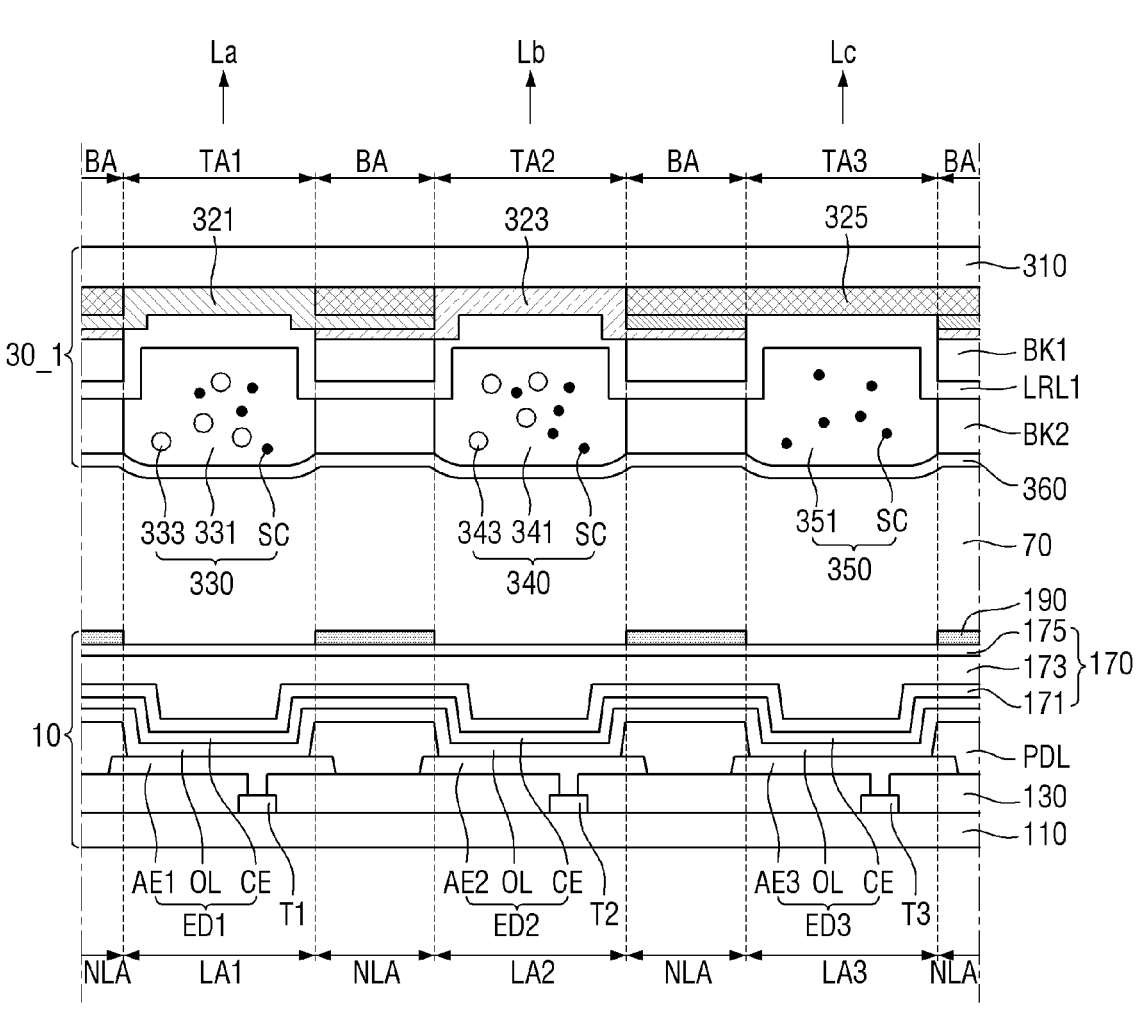
FIG. 17 is a cross-sectional view of a display device according to another embodiment.
Figure 17:

FIG. 17 is a cross-sectional view of a display device according to another embodiment.

Referring to FIG. 17, a color conversion substrate 30_1 according to the present embodiment is different from the color conversion substrate 30 according to FIG. 5 in that the second low refractive index layer LRL2 is omitted.

In more detail, in the color conversion substrate 30_1 according to the present embodiment, the second low refractive index layer LRL2 may be omitted. The first low refractive index layer LRL1 may be in direct contact with the wavelength conversion patterns 330 and 340 and the light transmission pattern 350, and the first low refractive index layer LRL1 may be in direct contact with the second bank BK2.

Other descriptions have been made, and thus, a redundant description will be omitted.

Figure 18:
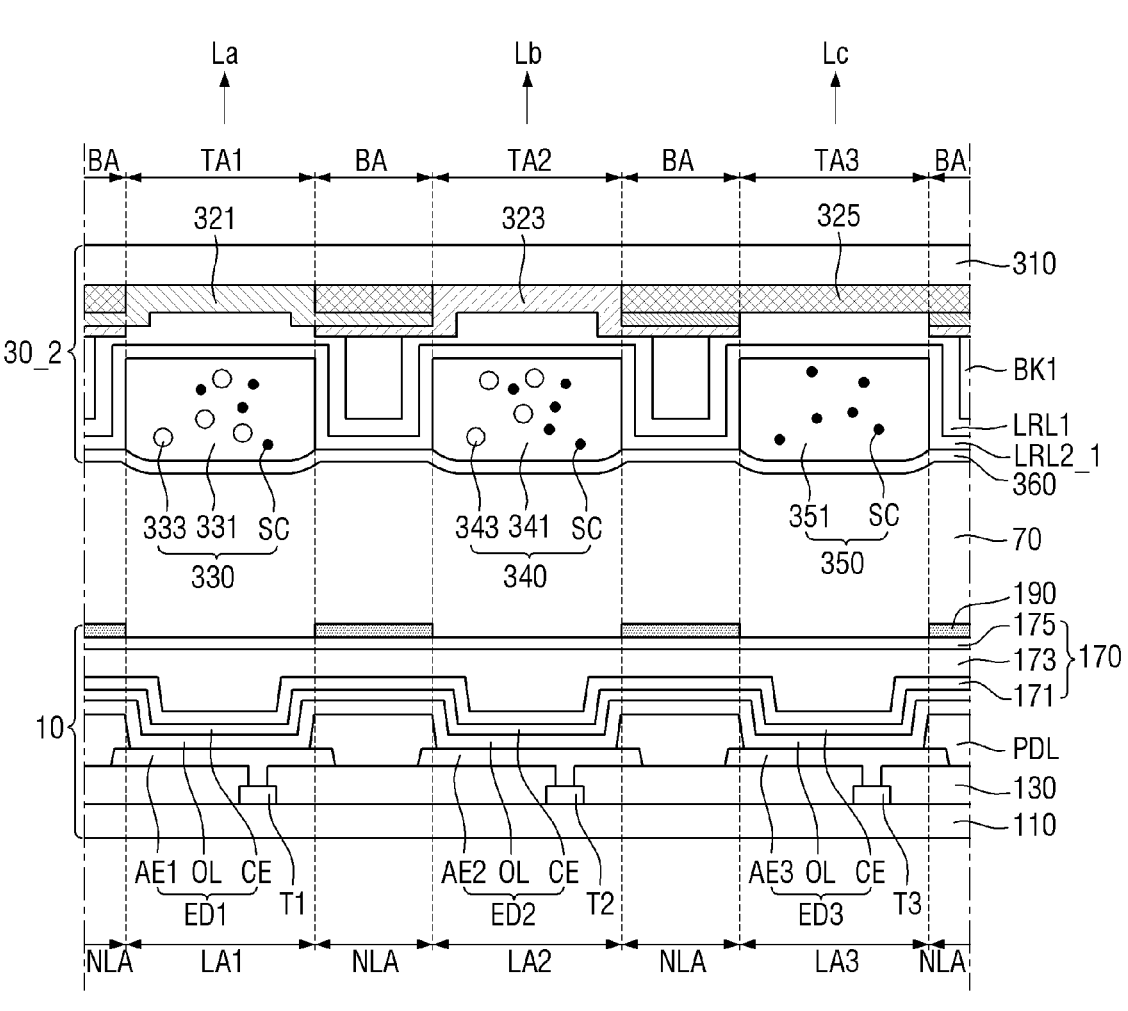
FIG. 18 is a cross-sectional view of a display device according to still another embodiment.
Figure 18:

FIG. 18 is a cross-sectional view of a display device according to still another embodiment.

Referring to FIG. 18, a color conversion substrate 30_2 according to the present embodiment is different from the color conversion substrate 30 according to FIG. 5 in that the second bank BK2 is omitted.

In more detail, in the color conversion substrate 30_2 according to the present embodiment, the second bank BK2 may be omitted, and a second low refractive index layer LRL2_1 may be in direct contact with the light transmission pattern 350 and the wavelength conversion patterns 330 and 340. According to the present embodiment, one surfaces (or bottom surfaces) of the wavelength conversion patterns 330 and 340 and the light transmission pattern 350 facing the filling layer 70 may be substantially positioned on the same line as one surface (or bottom surface) of the second low refractive index layer LRL2 facing the filling layer 70.

In the present embodiment, the second low refractive index layer LRL2_1 may further include a liquid repellent material. In some embodiments, the liquid repellent material may be dispersed and disposed inside the material of the second low refractive index layer LRL2_1. In some other embodiments, the liquid repellent material may be formed by being coated on the surface of the second low refractive index layer LRL2_1 (the bottom surface facing the filling layer 70 and side surfaces facing the wavelength conversion patterns 330 and 340 and the light transmission pattern 350). The liquid repellent material may include fluorine, silane, a gelling agent, or silica, but is not limited thereto.

Other descriptions have been made, and thus, a redundant description will be omitted below.

Figure 19:
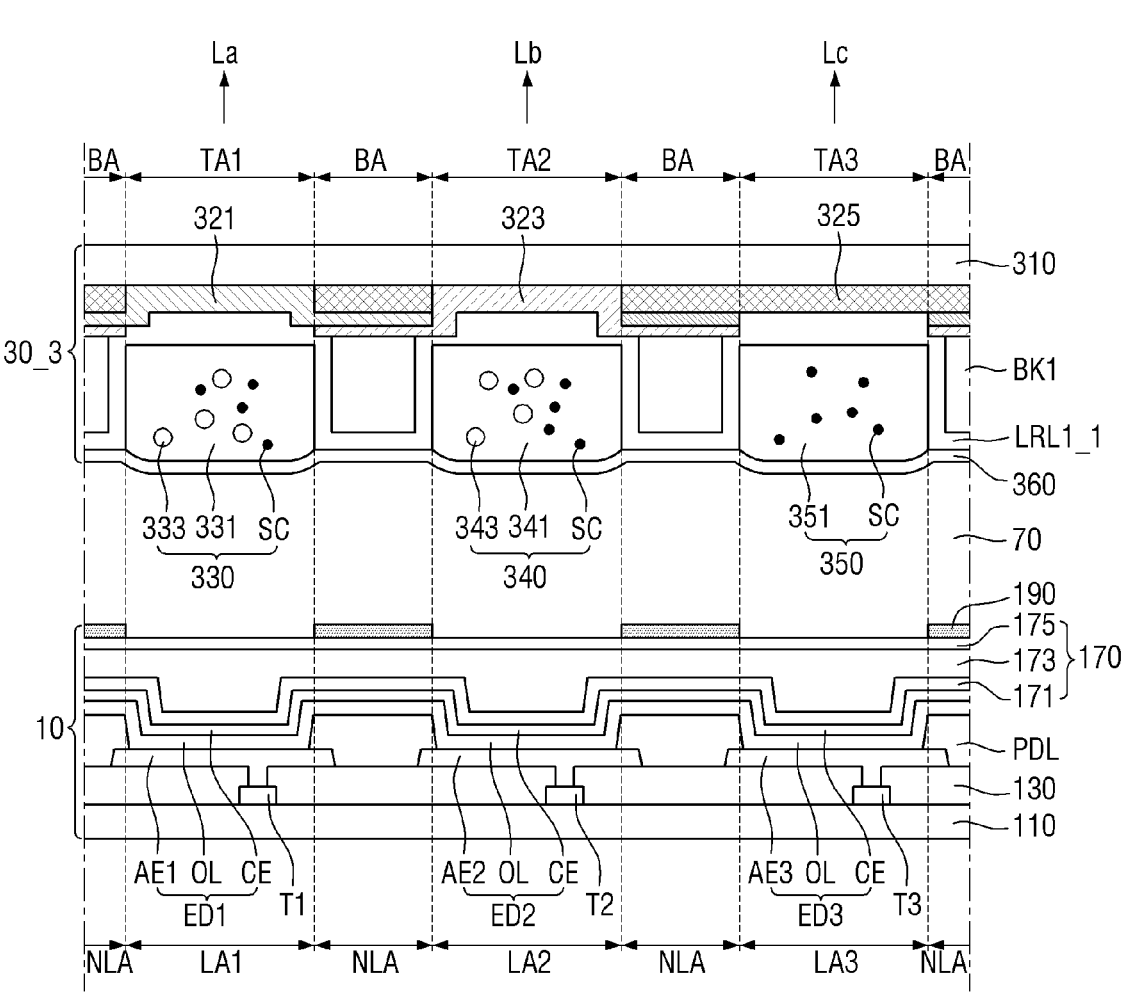
FIG. 19 is a cross-sectional view of a display device according to still another embodiment.
Figure 19:

FIG. 19 is a cross-sectional view of a display device according to still another embodiment.

Referring to FIG. 19, a color conversion substrate 30_3 according to the present embodiment is different from the color conversion substrate 30_2 according to FIG. 18 in that the second low refractive index layer LRL2_1 is omitted.

In more detail, in the color conversion substrate 30_3 according to the present embodiment, a first low refractive index layer LRL1_1 may be in direct contact with the light transmission pattern 350 and the wavelength conversion patterns 330 and 340 that are adjacent.

The first low refractive index layer LRL1_1 may further include a liquid repellent material. In some embodiments, the liquid repellent material may be dispersed and disposed inside the material of the first low refractive index layer LRL1_1. In some other embodiments, the liquid repellent material may be formed by being coated on the surface of the first low refractive index layer LRL1_1 (the bottom surface facing the filling layer 70 and the side surfaces facing the wavelength conversion patterns 330 and 340 and the light transmission pattern 350). The liquid repellent material may include fluorine, silane, a gelling agent, or silica, but is not limited thereto.

Other descriptions have been made, and thus, a redundant description will be omitted below.

Figure 20:
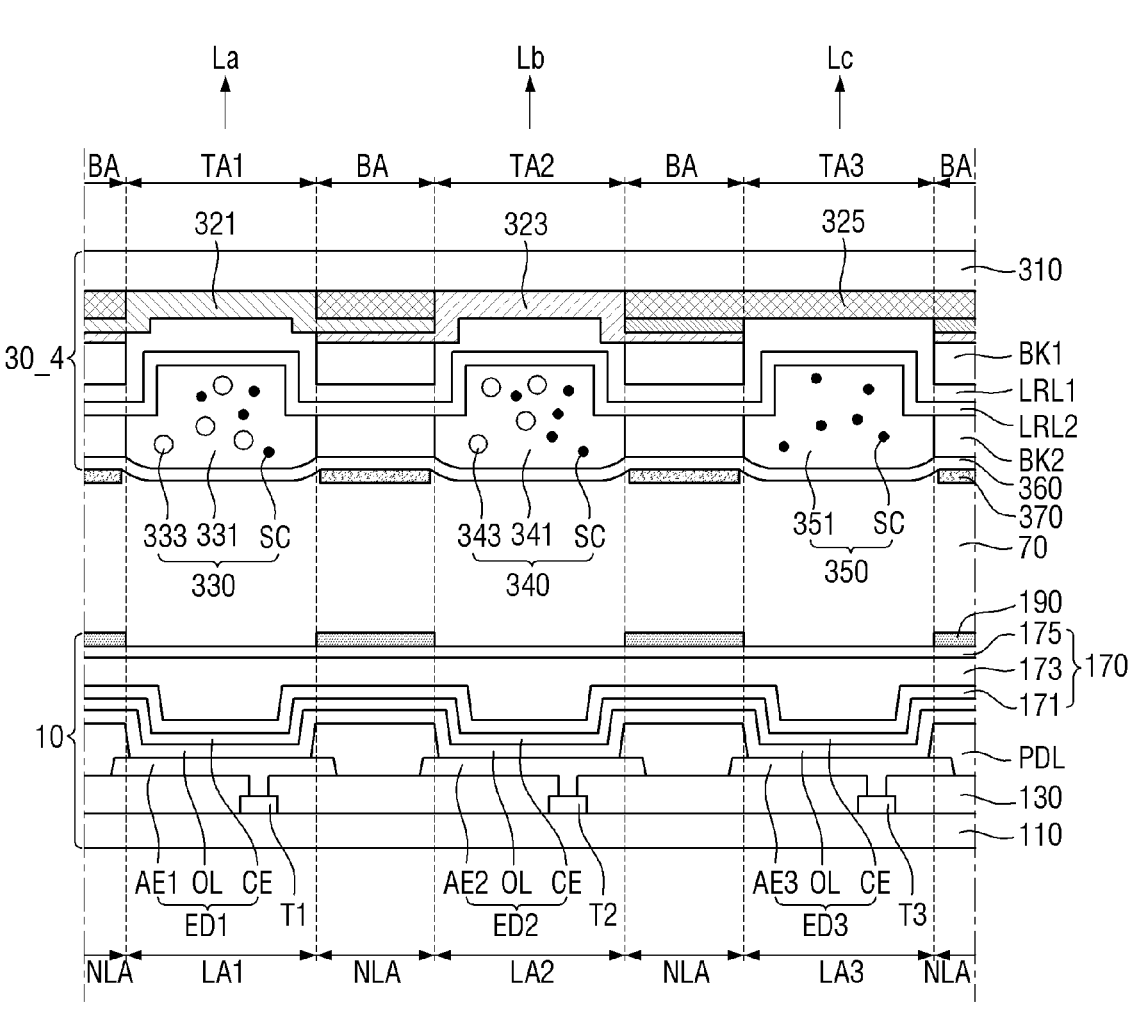
FIG. 20 is a cross-sectional view of a display device according to still another embodiment.
Figure 20:
Figure 21:
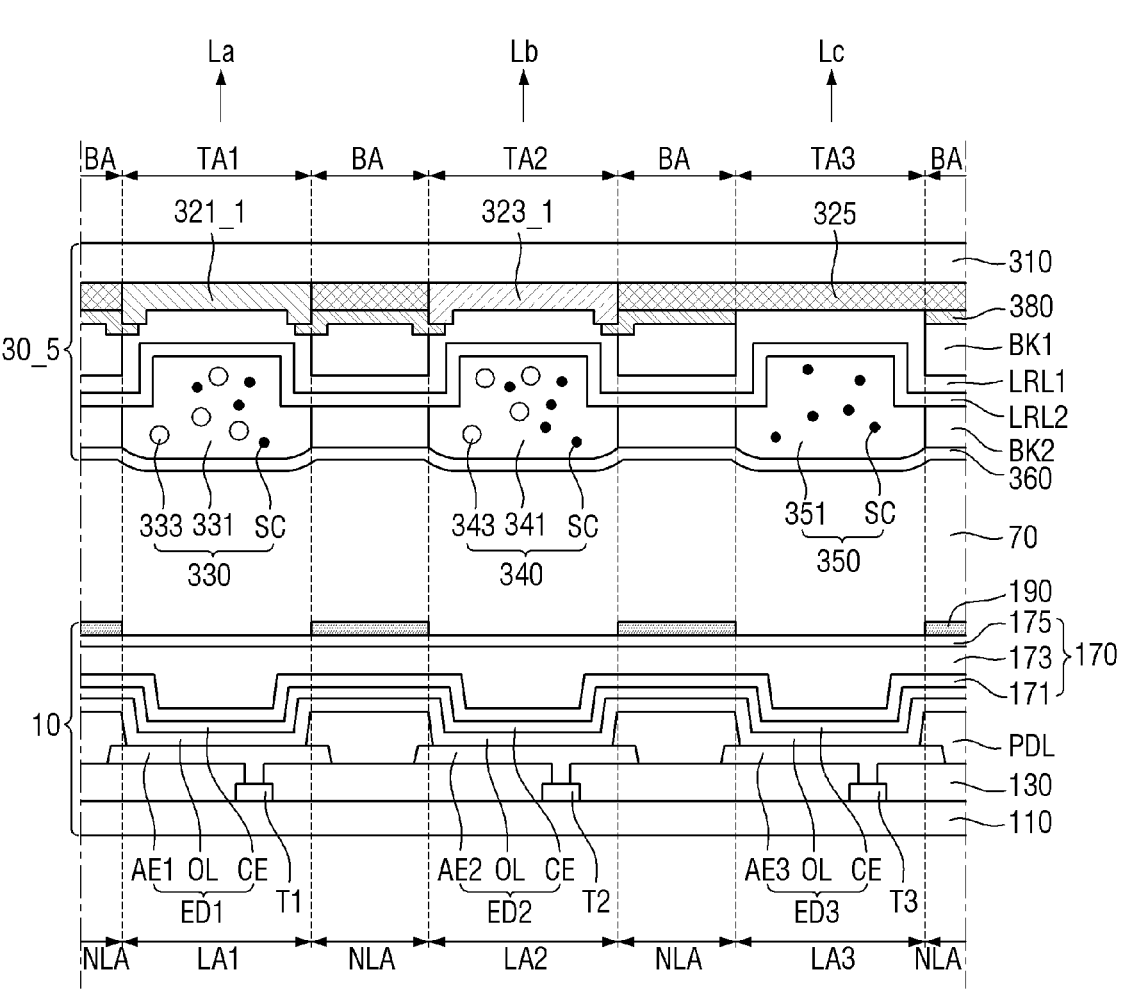
FIGS. 21 to 24 are cross-sectional views of a display device according to still another embodiment.
Figure 21:
Figure 22:
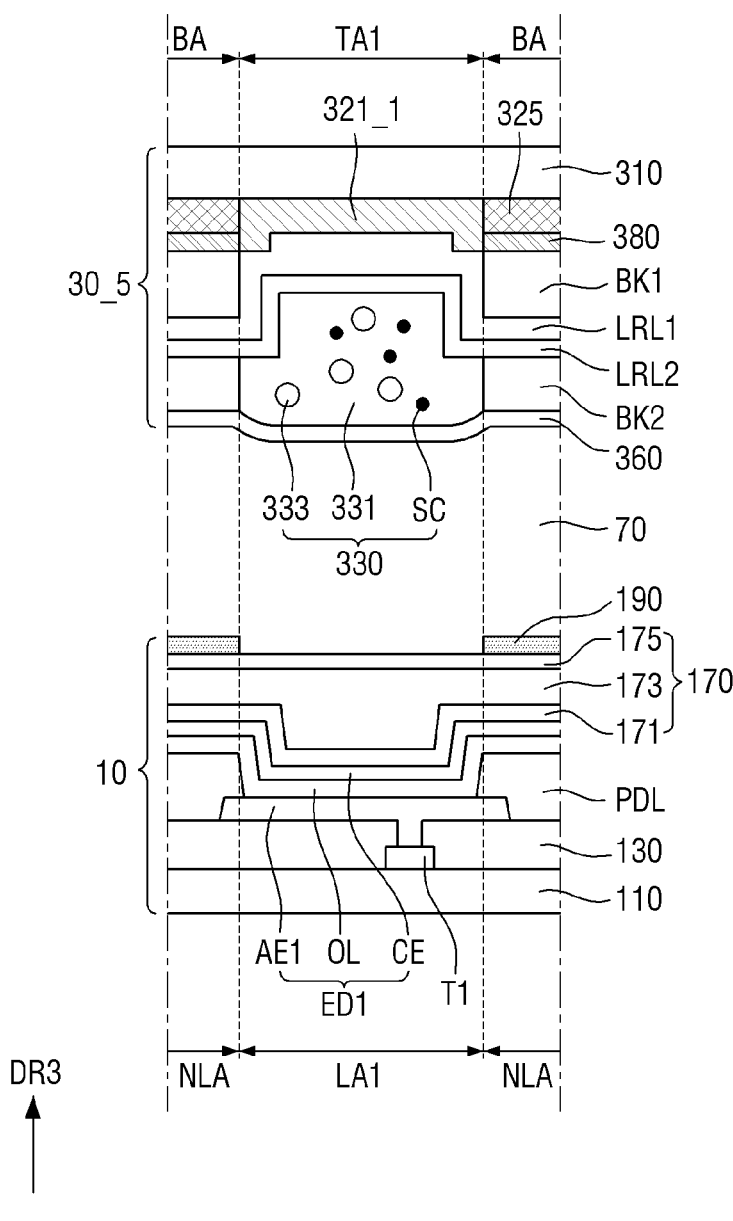
Figure 23:
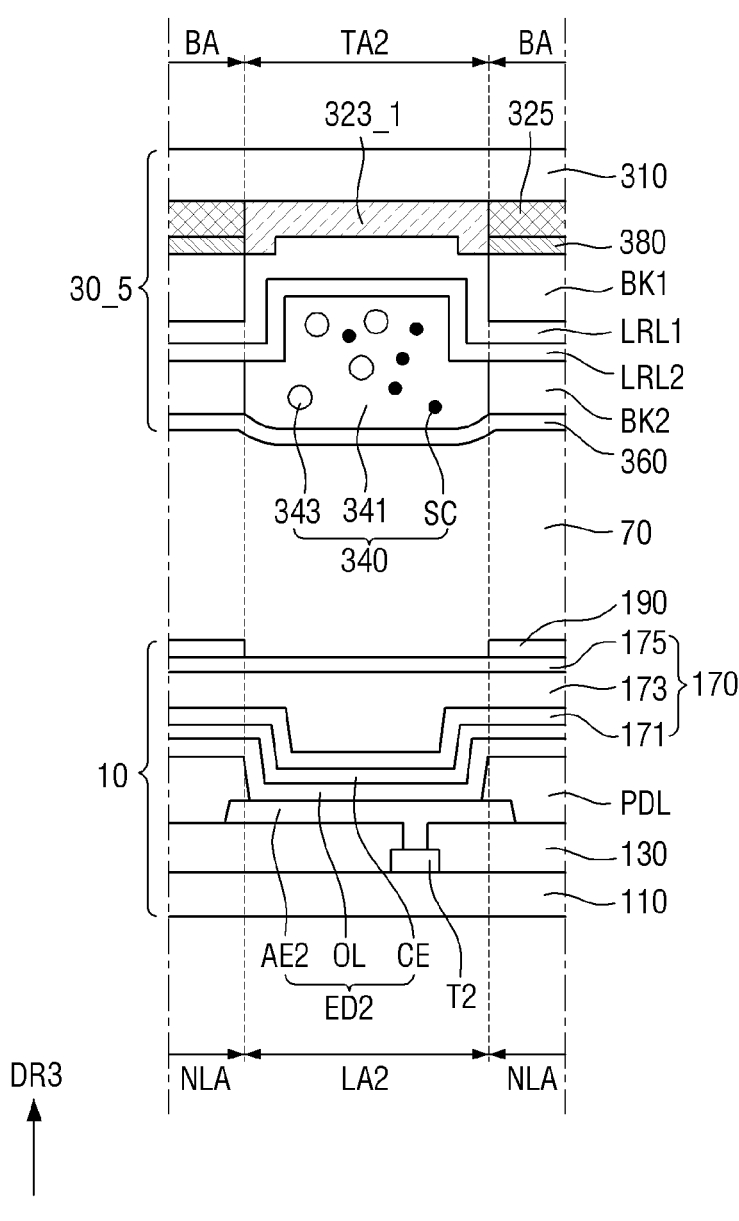
Figure 24:
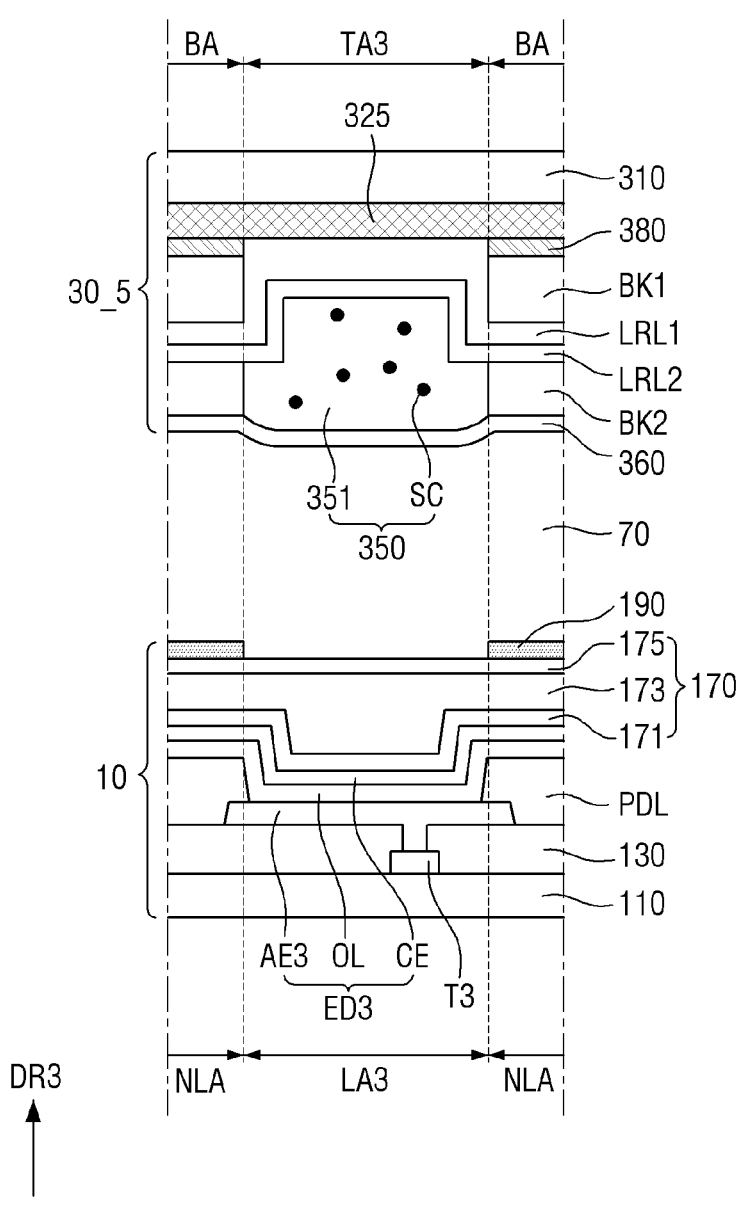

FIG. 20 is a cross-sectional view of a display device according to still another embodiment.

Referring to FIG. 20, a color conversion substrate 30_4 according to the present embodiment is different from the color conversion substrate 30 according to FIG. 5 in that a second light blocking member 370 is further disposed between the first capping layer 360 and the filling layer 70 in the light blocking area BA.

In more detail, in the color conversion substrate 30_4 according to the present embodiment, the second light blocking member 370 may be further disposed between the first capping layer 360 and the filling layer 70 in the light blocking area BA. The second light blocking member 370 may be selected from materials exemplified for the first light blocking member 190 described above in FIG. 5.

Other descriptions have been made, and thus, a redundant description will be omitted below.

Figure 25:
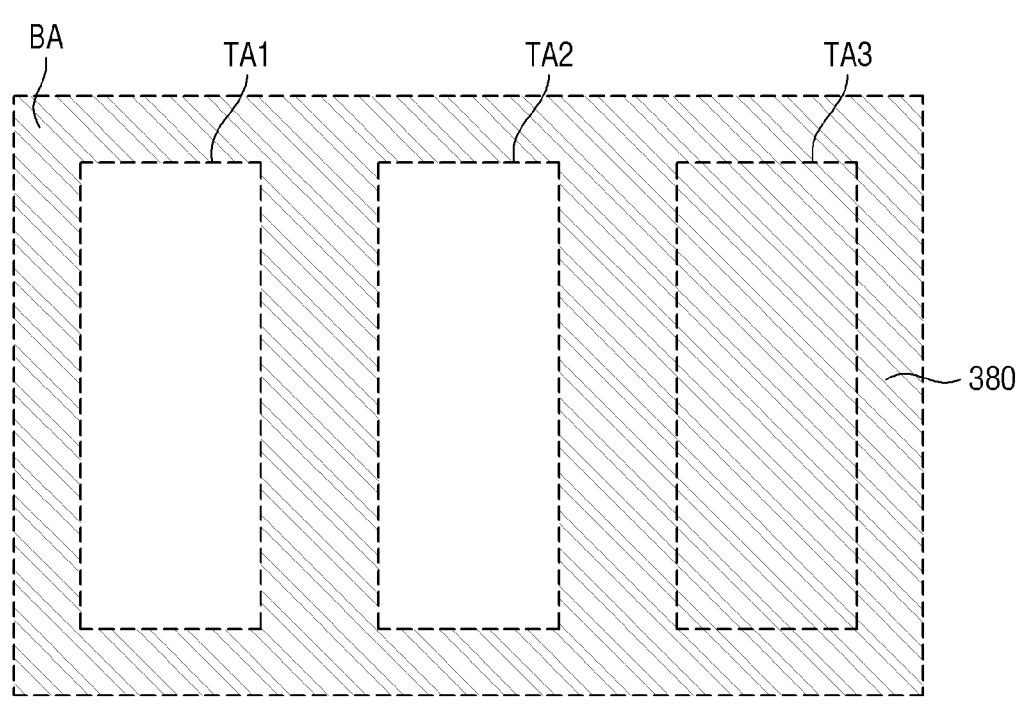
FIG. 25 is a plan view schematically illustrating the arrangement of a third color filter in a color conversion substrate of a display device according to still another embodiment.
Figure 25:
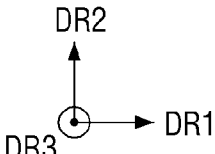
Figure 26:
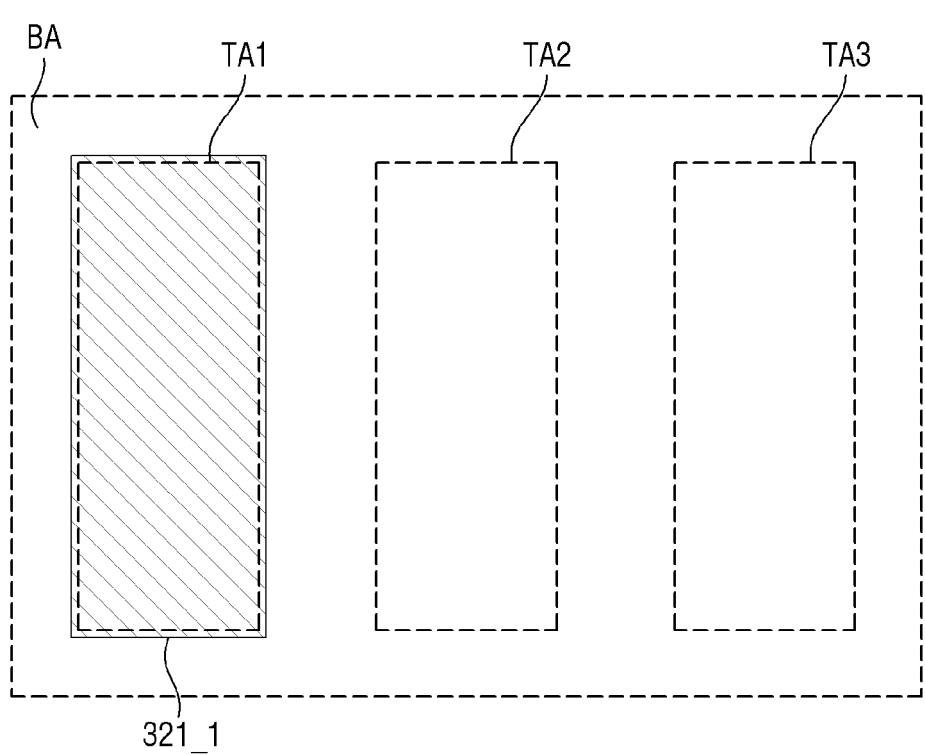
FIG. 26 is a plan view schematically illustrating the arrangement of a first color filter in a color conversion substrate of a display device according to still another embodiment.
Figure 26:
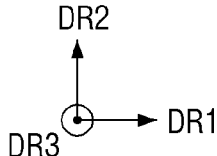
Figure 27:
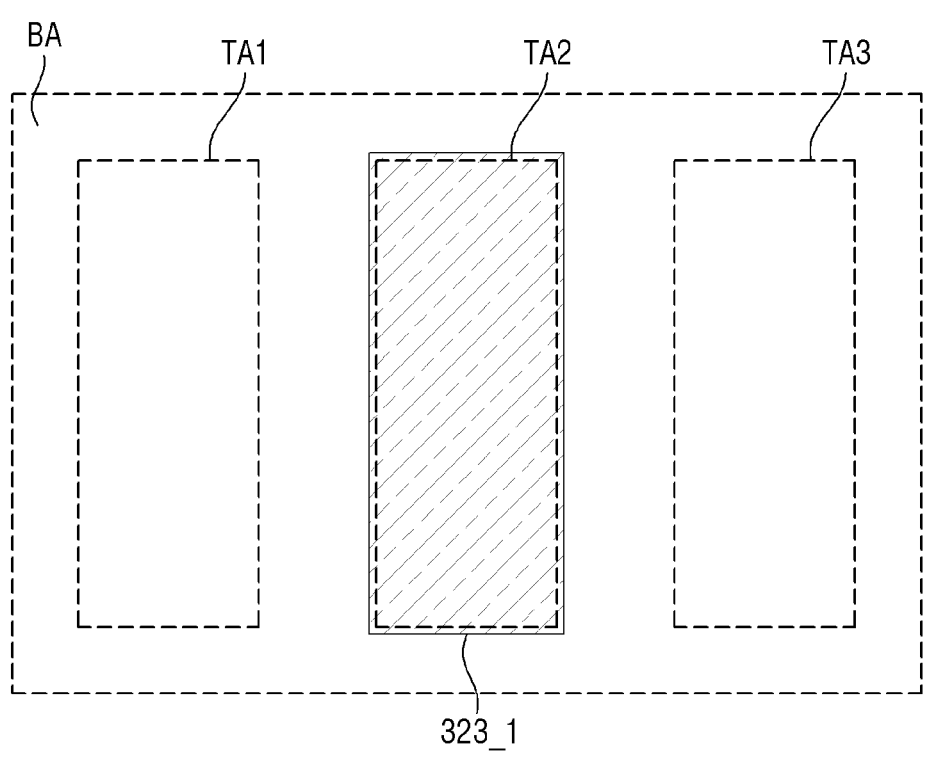
FIG. 27 is a plan view schematically illustrating the arrangement of a second color filter in a color conversion substrate of a display device according to still another embodiment.
Figure 27:
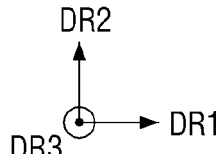

FIGS. 21 to 24 are cross-sectional views of a display device according to still another embodiment. FIG. 25 is a plan view schematically illustrating the arrangement of a third color filter in a color conversion substrate of a display device according to still another embodiment. FIG. 26 is a plan view schematically illustrating the arrangement of a first color filter in a color conversion substrate of a display device according to still another embodiment. FIG. 27 is a plan view schematically illustrating the arrangement of a second color filter in a color conversion substrate of a display device according to still another embodiment.

Referring to FIGS. 21 to 27, a color conversion substrate 30_5 according to the present embodiment is different from the color conversion substrate 30 according to one embodiment in that a third light blocking member 380 is further disposed between the second base substrate 310 and the first bank BK1 in the light blocking area BA.

In more detail, in the color conversion substrate 30_5 according to the present embodiment, the third light blocking member 380 may be further disposed between the second base substrate 310 and the first bank BK1 in the light blocking area BA. The third light blocking member 380 may be formed after forming color filters 321_1, 323_1, and 325. The third light blocking member 380 may be disposed between the color filters 321_1, 323_1, and 325 and the first bank BK1. The third light blocking member 380 may be selected from exemplified materials of the second light blocking member 370 described above.

The third light blocking member 380 may be disposed to overlap the light blocking area BA and may not be disposed to overlap the light transmitting areas TA1, TA2, and TA3 in a plan view.

In the present embodiment, the third color filter 325 may be disposed over the third light transmitting area TA3 and the light blocking area BA. However, the first color filter 321_1 and the second color filter 323_1 may be disposed in the corresponding light transmitting areas TA1 and TA2 but may not be substantially disposed in the light blocking area BA.

The third light blocking member 380 may be directly disposed on one surface of the third color filter 325 in the light blocking area BA.

In some embodiments, a black matrix of a display device may be applied to the third light blocking member 380.

Figure 28:
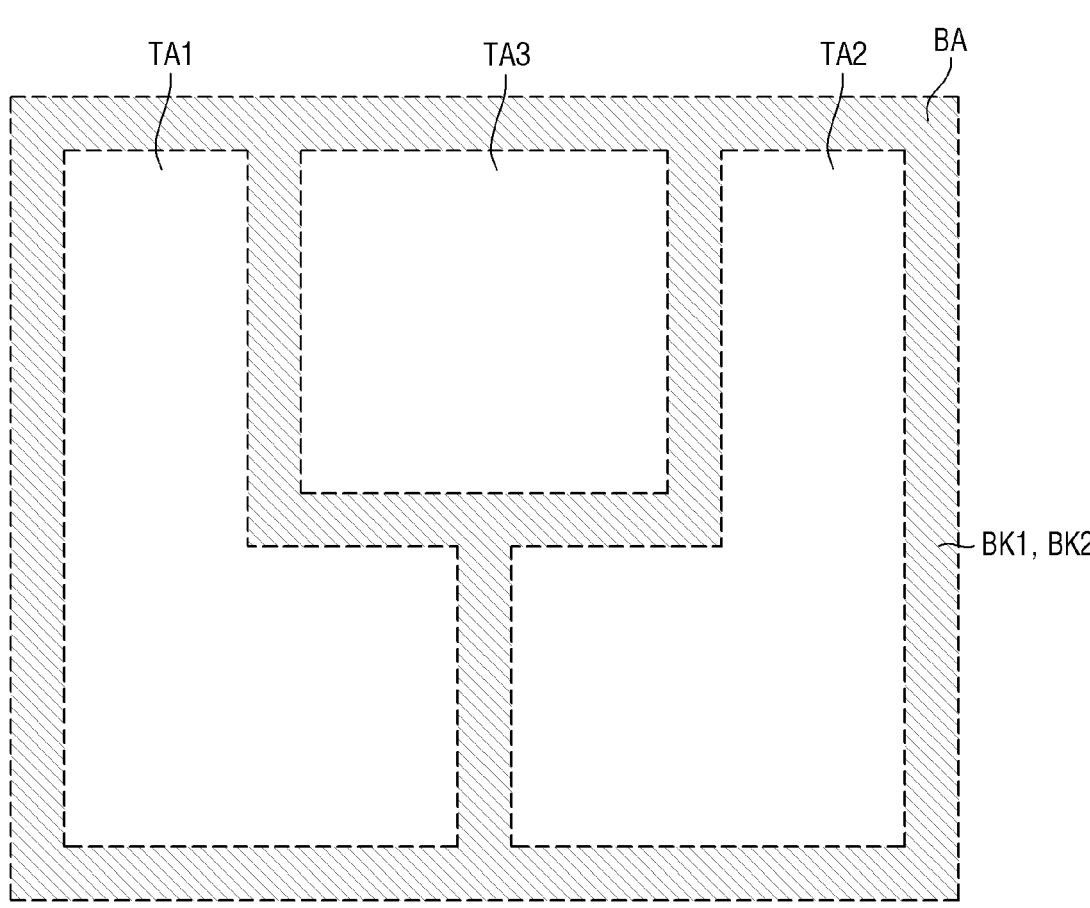
FIG. 28 is a schematic plan view of a color conversion substrate in a display area according to a modified example.
Figure 28:
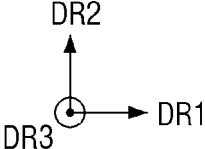

FIG. 28 is a schematic plan view of a color conversion substrate in a display area according to a modified example.

FIG. 28 illustrates that the shape of each of the light transmitting areas TA1, TA2, and TA3 of the color conversion substrate according to one embodiment may be variously modified.

Referring to FIG. 28, the first light transmitting area TA1 and the second light transmitting area TA2 may have a planar shape including a line portion extending along the second direction DR2 and a protrusion portion protruding toward the third light transmitting area TA3 from the line portion. The third light transmitting area TA3 may have a square planar shape with short sides and long sides equal in length, but may have a rectangular planar shape without being limited thereto.

In addition, although not illustrated, the planar shape of each of the light transmitting areas TA1, TA2, and TA3 of the color conversion substrate may be variously modified.

Figure 29:
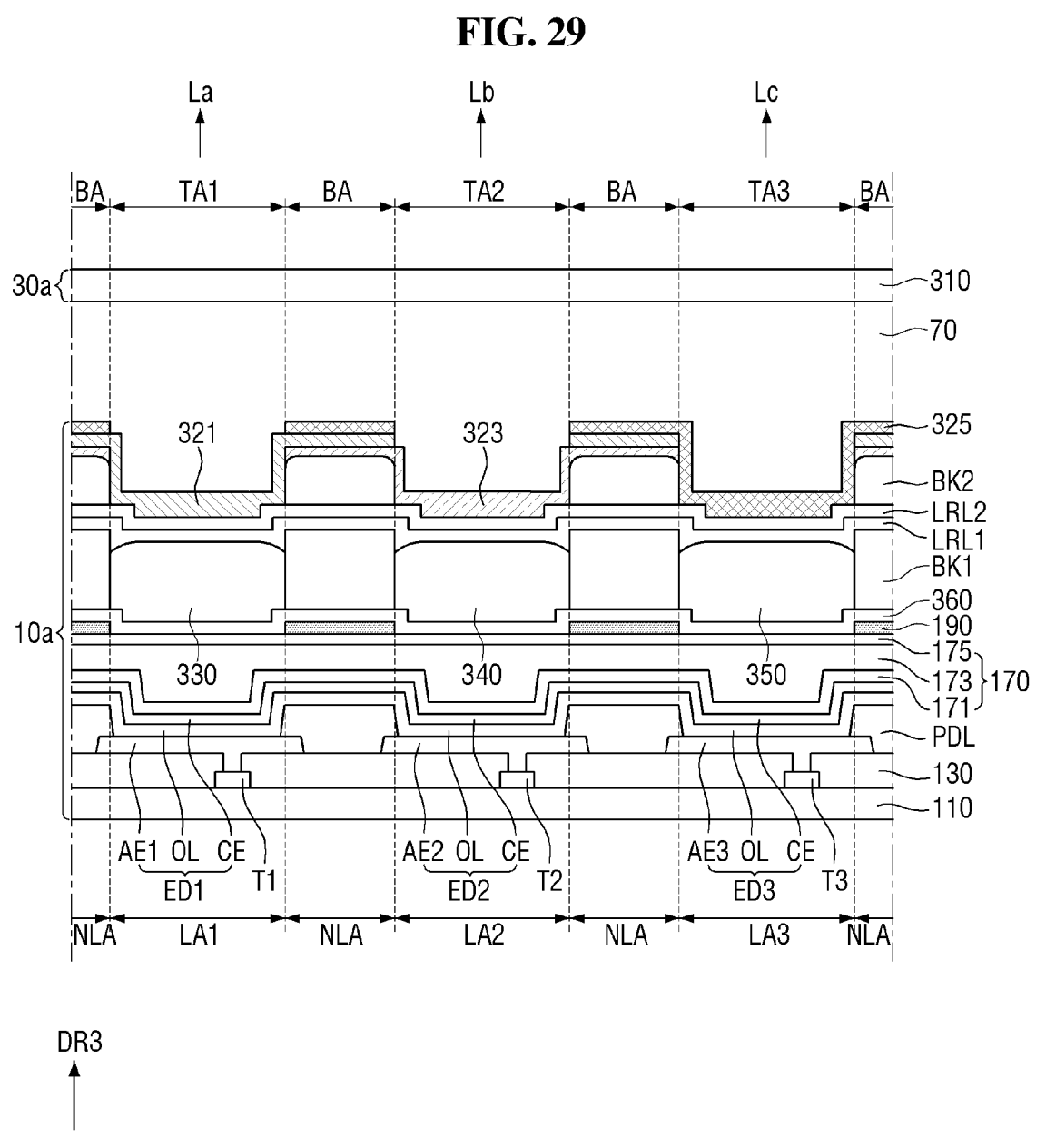

FIG. 29 is a cross-sectional view of a display device according to still another embodiment.

Referring to FIG. 29, in the display device according to the present embodiment, a display substrate 10a may include, among components of the color conversion substrate 30 illustrated in FIG. 5, remaining components other than the second base substrate 310, and a color conversion substrate 30a may include the second base substrate 310.

The display device according to the present embodiment may include the base substrate 110 (or first base substrate 110), the switching elements T1, T2, and T3 on the base substrate 110, the insulating layer 130 on the switching elements T1, T2, and T3, the anode electrodes AE1, AE2, and AE3 on the insulating layer 130, the pixel defining layer PDL disposed on the anode electrodes AE1, AE2, and AE3 and including openings exposing the top surfaces of the anode electrodes AE1, AE2, and AE3, the light emitting layer OL disposed on the anode electrodes AE1, AE2, and AE3, the cathode electrode CE (the anode electrode, the light emitting layer OL, and the cathode electrode CE form a light emitting element) on the light emitting layer OL, the thin film encapsulation layer 170 on the cathode electrode CE, the first light blocking member 190 disposed on the thin film encapsulation layer 170 in the non-emission area NLA, the first capping layer 360 on the first light blocking member 190, the light transmission pattern 350, the second wavelength conversion pattern 340, and the first wavelength conversion pattern 330 on the first capping layer 360, the first bank BK1 between the light transmission pattern 350 and the second wavelength conversion pattern 340, between the second wavelength conversion pattern 340 and the first wavelength conversion pattern 330, and between the light transmission pattern 350 and the first wavelength conversion pattern 330 on the first capping layer 360, the first low refractive index layer LRL1 and the second low refractive index layer LRL2 sequentially stacked on the light transmission pattern 350, the second wavelength conversion pattern 340, and the first wavelength conversion pattern 330 and on the first bank BK1, the second bank BK2 disposed on the second low refractive index layer LRL2 in the light blocking area BA, the color filters 321, 323, and 325 disposed on the second low refractive index layer LRL1 and the second bank BK2, the filling layer 70 disposed on the color filters 321, 323, and 325, and the second base substrate 310 disposed on the filling layer 70.

Since components identical to components described with reference to FIG. 5 have been described above in FIG. 5, overlapping descriptions thereof will be omitted.

The first capping layer 360 may cover the first light blocking member 190. The first capping layer 360 may be in contact with the thin film encapsulation layer 170 and the first light blocking member 190. In some embodiments, the first capping layer 360 may be omitted, and in this case, the wavelength conversion patterns 330 and 340, the light transmission pattern 350, and the first bank BK1 may be in contact with the second encapsulation inorganic layer 175.

The first bank BK1 may be disposed between the light transmission pattern 350 and the second wavelength conversion pattern 340, between the second wavelength conversion pattern 340 and the first wavelength conversion pattern 330, and between the light transmission pattern 350 and the first wavelength conversion pattern 330 on the first capping layer 360. The first bank BK1 may be disposed in the light blocking area BA.

The first low refractive index layer LRL1 and the second low refractive index layer LRL2 sequentially stacked may be disposed on the light transmission pattern 350, the second wavelength conversion pattern 340, and the first wavelength conversion pattern 330 and on the first bank BK1.

The second bank BK2 may be disposed on the second low refractive index layer LRL2 in the light blocking area BA. The color filters 321, 323, and 325 may be disposed on the second low refractive index layer LRL1 and the second bank BK2. Since the disposition of the color filters 321, 323, and 325 is substantially the same as the disposition of FIG. 5, a detailed description thereof will be omitted.

The filling layer 70 may be disposed on the color filters 321, 323, and 325. The second base substrate 310 may be disposed on the filling layer 70. In some embodiments, the second base substrate 310 and the filling layer 70 may be omitted, and when the second base substrate 310 and the filling layer 70 are omitted, a separate protective layer (not illustrated) may be disposed on the color filters 321, 323, and 325.

Figure 30:
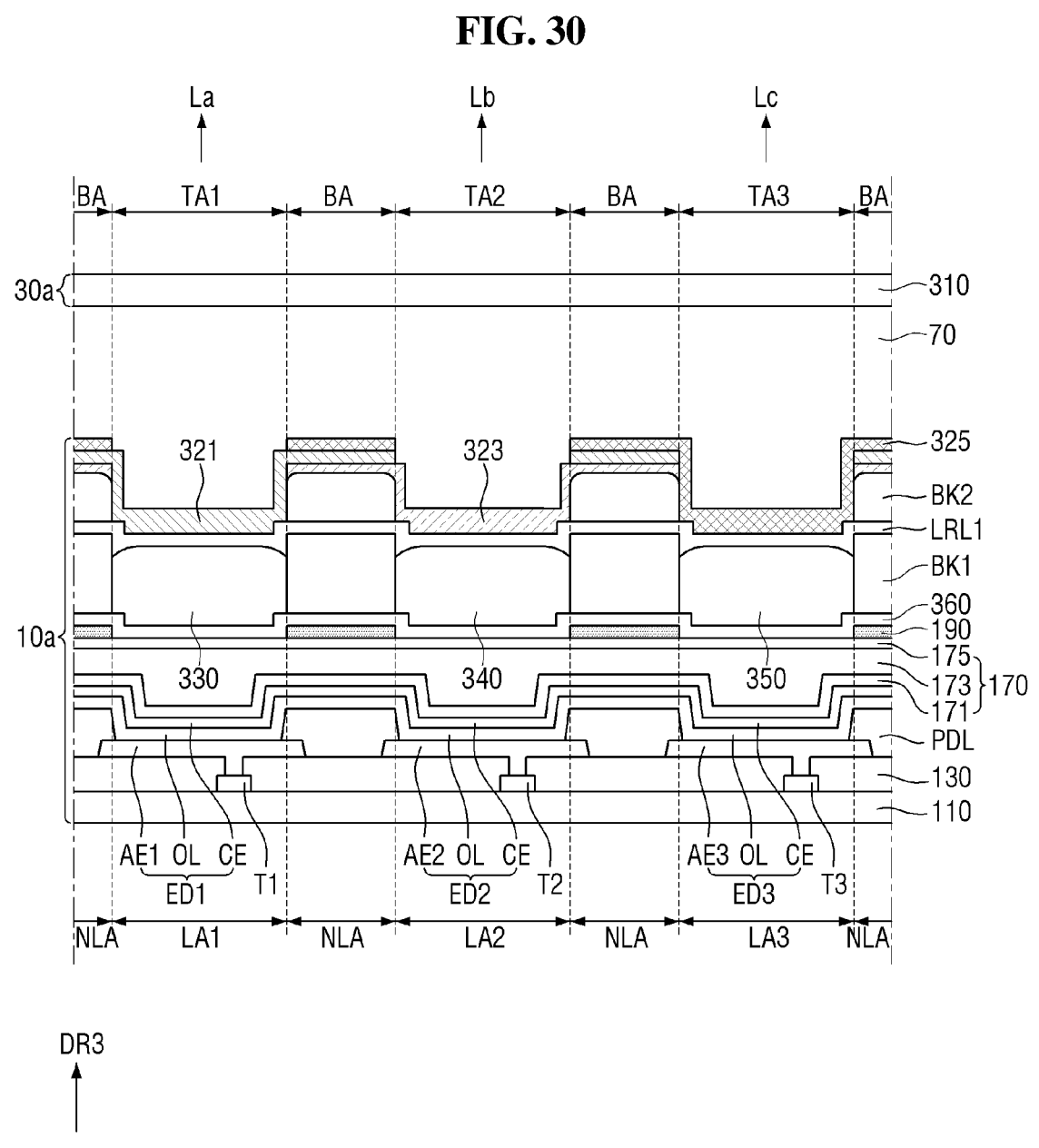

FIG. 30 is a cross-sectional view of a display device according to still another embodiment.

Referring to FIG. 30, a display substrate 30b of the display device according to the present embodiment is different from the display device according to FIG. 29 in that the second low refractive index layer LRL2 may be omitted as illustrated in FIG. 17.

Other descriptions have been made with reference to FIGS. 29 and 17, and thus, a redundant description will be omitted below.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the drawings are schematic in nature and their shapes are not intended to illustrate the actual shape of a region of a device and are not intended to be limiting.

The invention claimed is:

1. A display device comprising:
a display substrate comprising a light emitting element disposed on a first base substrate; and
a color conversion substrate facing the display substrate, wherein the color conversion substrate comprises:
a second base substrate in which a first light transmitting area, a second light transmitting area, a third light transmitting area, and a light blocking area disposed between adjacent light transmitting areas among the first to third light transmitting areas are defined;
a first bank disposed in the light blocking area on the second base substrate;
a first low refractive index layer disposed between the second base substrate and the display substrate and covering the first bank;
a first wavelength conversion pattern disposed in the first light transmitting area and between the first low refractive index layer and the display substrate;
a second wavelength conversion pattern disposed in the second light transmitting area and between the first low refractive index layer and the display substrate; and
a light transmission pattern disposed in the third light transmitting area and between the first low refractive index layer and the display substrate,
wherein the first low refractive index layer has a refractive index lower than a refractive index of at least one of the first wavelength conversion pattern or the second wavelength conversion pattern,
wherein, in the first to third light transmitting areas, the first low refractive index layer has a first thickness,
wherein, in the light blocking area, the first low refractive index layer has a second thickness, and
wherein the first thickness is greater than the second thickness.

2. The display device of claim 1, wherein
the first bank comprises a bottom surface facing the display substrate and a side surface facing one of the adjacent light transmitting areas, and
the first low refractive index layer covers the bottom surface and the side surface of the first bank.

3. The display device of claim 2, wherein the first low refractive index layer is in contact with each of the bottom surface and the side surface of the first bank.

4. The display device of claim 2, further comprising a second bank disposed between the display substrate and the first low refractive index layer on the light blocking area,
wherein the second bank is in direct contact with the first low refractive index layer.

5. The display device of claim 1, wherein
the refractive index of the first low refractive index layer is about 1.3 to about 1.4, and
the refractive index of the at least one of the first wavelength conversion pattern or the second wavelength conversion pattern is about 1.6 or more.

6. The display device of claim 5, wherein the first low refractive index layer includes an organic material and inorganic particles, and the inorganic particles are dispersed in the organic material and have hollow particles.

7. The display device of claim 1, wherein the first thickness is at least five times greater than the second thickness.

8. The display device of claim 1, wherein the light emitting element emits light of a first color,
the first wavelength conversion pattern is configured to convert the light of the first color into light of a second color,
the second wavelength conversion pattern is configured to convert the light of the first color into light of a third color, and
the light transmission pattern is configured to transmit the light of the first color as it is without wavelength change.

9. The display device of claim 8, further comprising:
a first color filter disposed in the first light transmitting area and between the second base substrate and the first low refractive index layer;
a second color filter disposed in the second light transmitting area and between the second base substrate and the first low refractive index layer; and
a third color filter disposed in the third light transmitting area and the light blocking area and between the second base substrate and the first low refractive index layer,
wherein the first color filter is configured to block the light of the first color and the light of the third color,
the second color filter is configured to block the light of the first color and the light of the second color, and
the third color filter is configured to block the light of the second color and the light of the third color.

10. The display device of claim 9, wherein the first color filter is further disposed in the adjacent light blocking area, and the second color filter is further disposed in the adjacent light blocking area.

11. The display device of claim 8, wherein the first reflective layer contacts at least one of the transistor layer, the light-emitting element layer, and the wavelength conversion layer.

12. A display device comprising:
a display substrate comprising a light emitting element disposed on a first base substrate; and
a color conversion substrate facing the display substrate, wherein the color conversion substrate comprises:
a second base substrate in which a first light transmitting area, a second light transmitting area, a third light transmitting area, and a light blocking area disposed between adjacent light transmitting areas among the first to third light transmitting areas are defined;
a first bank disposed in the light blocking area on the second base substrate;
a first low refractive index layer disposed between the second base substrate and the display substrate and covering the first bank;
a first wavelength conversion pattern disposed in the first light transmitting area and between the first low refractive index layer and the display substrate;
a second wavelength conversion pattern disposed in the second light transmitting area and between the first low refractive index layer and the display substrate; and
a light transmission pattern disposed in the third light transmitting area and between the first low refractive index layer and the display substrate,
wherein the first low refractive index layer has a refractive index lower than a refractive index of at least one of the first wavelength conversion pattern or the second wavelength conversion pattern, wherein the first bank comprises a bottom surface facing the display substrate and a side surface facing one of the adjacent light transmitting areas, wherein the first low refractive index layer covers the bottom surface and the side surface of the first bank, wherein a second low refractive index layer is disposed between the first low refractive index layer and the first to second wavelength conversion patterns, and between the first low refractive index layer and the light transmission pattern, and wherein the second low refractive index layer covers the bottom surface and the side surface of the first bank.

13. The display device of claim 12, wherein in the first to third light transmitting areas, the first low refractive index layer has a first thickness, in the light blocking area, the first low refractive index layer has a second thickness, and the first thickness is greater than the second thickness.

14. The display device of claim 12, wherein a refractive index of the second low refractive index layer is about 1.2 to about 1.3.

15. The display device of claim 12, wherein the second low refractive index layer includes an inorganic material.

16. The display device of claim 12, further comprising a second bank disposed between the display substrate and the second low refractive index layer on the light blocking area, wherein the second bank is in direct contact with the second low refractive index layer.

17. The display device of claim 16, wherein the second bank includes a liquid repellent material, and the first to second wavelength conversion patterns and the light transmission pattern each are in direct contact with the second low refractive index layer and the second bank.

18. A display device comprising:

a base substrate in which a first emission area, a second emission area, a third emission area, and a non-emission area disposed between adjacent emission areas are defined;

light emitting elements disposed in each of the emission areas on the base substrate;

a thin film encapsulation layer disposed on the light emitting elements;

first banks disposed on the thin film encapsulation layer and disposed in the non-emission area;

a first wavelength conversion pattern disposed between adjacent first banks among the first banks on the thin film encapsulation layer and disposed in the first emission area;

a second wavelength conversion pattern disposed between adjacent first banks among the first banks on the thin film encapsulation layer and disposed in the second emission area;

a light transmission pattern disposed between adjacent first banks among the first banks on the thin film encapsulation layer and disposed in the third emission area; and a low refractive index layer covering upper surfaces of the first and second wavelength conversion patterns, the light transmission pattern, and the first banks, wherein the low refractive index layer has a refractive index lower than a refractive index of at least one of the first wavelength conversion pattern or the second wavelength conversion pattern.

19. The display device of claim 18, wherein the low refractive index layer is in direct contact with a top surface and a side surface of the first banks.

20. The display device of claim 19, further comprising a second bank disposed on the non-emission area on the low refractive index layer.

21. The display device of claim 20, further comprising:

a first color filter disposed in the first emission area;

a second color filter disposed in the second emission area; and a third color filter disposed in the third emission area, the first to third color filters being disposed on the low refractive index layer and the second bank.

22. The display device of claim 21, wherein the refractive index of the low refractive index layer is about 1.3 to about 1.4, and the refractive index of the at least one of the first wavelength conversion pattern or the second wavelength conversion pattern is about 1.6 or more.

* * * * *